(12) United States Patent
Kim

(10) Patent No.: US 12,041,774 B2
(45) Date of Patent: Jul. 16, 2024

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 446 days.

(21) Appl. No.: 17/327,258

(22) Filed: May 21, 2021

(65) Prior Publication Data

US 2022/0165748 A1 May 26, 2022

(30) Foreign Application Priority Data

Nov. 24, 2020 (KR) .......................... 10-2020-0158823

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ................................. H10B 43/27; H10B 43/20
See application file for complete search history.

(56) References Cited

U.S. PATENT DOCUMENTS

| | | |
|---|---|---|
| 10,115,681 B1 | 10/2018 | Ariyoshi |
| 10,680,012 B2 | 6/2020 | Asai et al. |
| 2015/0303214 A1 | 10/2015 | Kim et al. |
| 2020/0273881 A1 | 8/2020 | Kim |
| 2020/0402995 A1 | 12/2020 | Cheon |
| 2021/0091105 A1* | 3/2021 | Kim ................. H10B 41/41 |
| 2021/0375905 A1* | 12/2021 | Hwang ............. H10B 41/27 |
| 2022/0037351 A1* | 2/2022 | Lee .................. H10B 41/27 |
| 2022/0051979 A1* | 2/2022 | Kuroko ............ H10B 43/27 |

* cited by examiner

*Primary Examiner* — Christopher A Johnson
(74) *Attorney, Agent, or Firm* — William Park & Associates Ltd.

(57) ABSTRACT

A semiconductor device includes a cell stack structure including first cell stack layers and stack conductive layers, which are alternately stacked. The semiconductor device also includes a dummy stack structure including first dummy stack layers and second dummy stack layers, which are alternately stacked. The semiconductor device further includes a cell plug penetrating the cell stack structure and a cell chip guard penetrating the dummy stack structure, wherein the cell chip guard surrounds the cell stack structure and the cell plug. A level of a bottom surface of a cell chip guard is substantially equal to that of a bottom surface of the cell plug.

19 Claims, 20 Drawing Sheets

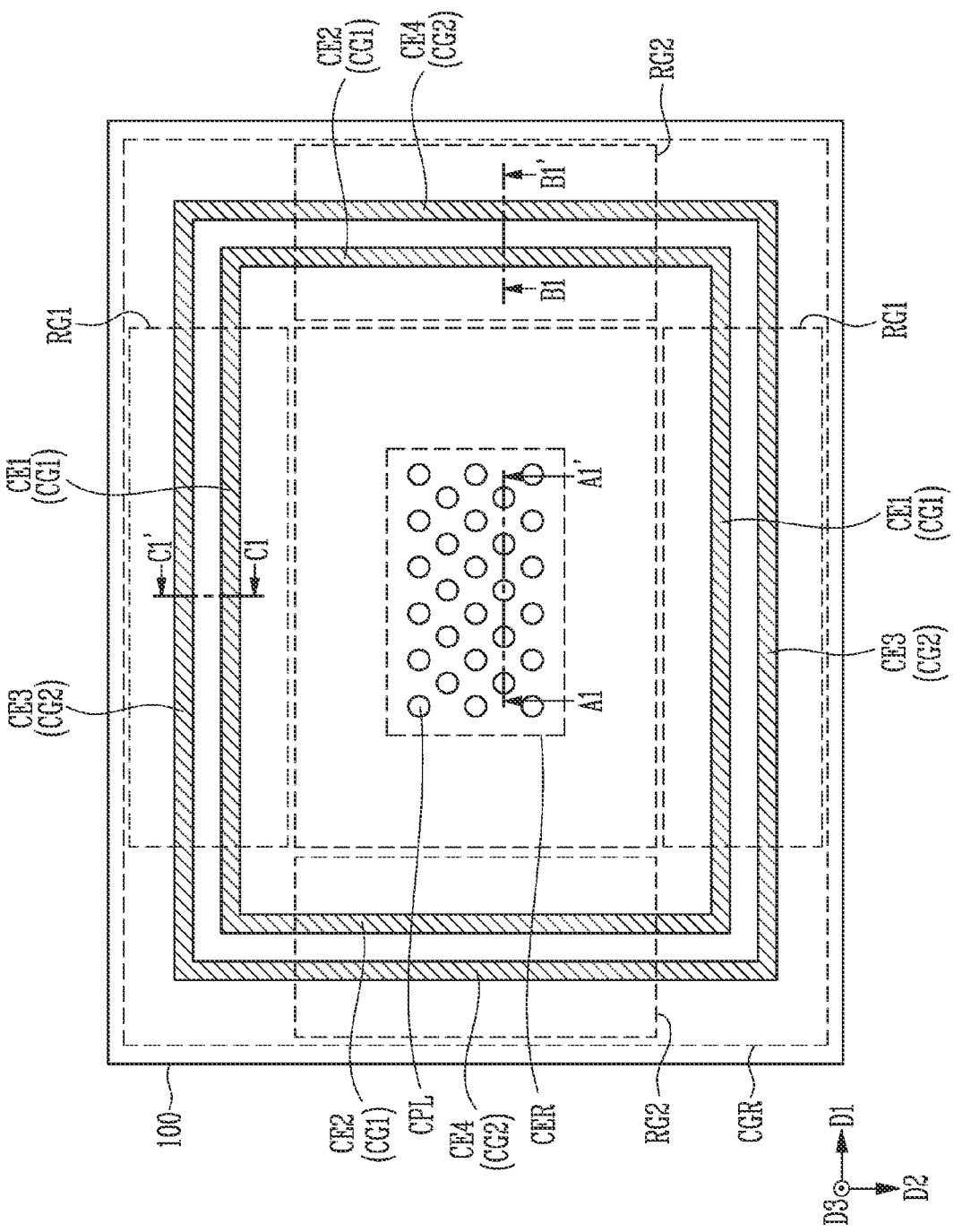

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2020-0158823, filed on Nov. 24, 2020, in the Korean Intellectual Property Office, the entire disclosure of which is incorporated herein by reference.

BACKGROUND

1. Technical Field

The present disclosure generally relates to a semiconductor device and a manufacturing method of the semiconductor device, and more particularly, to a three-dimensional semiconductor device and a manufacturing method of the three-dimensional semiconductor device.

2. Related Art

A semiconductor device includes memory cells capable of storing data. A three-dimensional semiconductor device includes three-dimensionally arranged memory cells, so that the number of memory cells per unit area of a substrate can be increased.

In order to improve the degree of integration of the three-dimensional semiconductor device, a number of stacked memory cells may be increased. The operational reliability of the three-dimensional semiconductor device, however, may deteriorate as the number of stacked memory cells increases.

SUMMARY

Some embodiments provide a semiconductor device having improved operational reliability and a manufacturing method of the semiconductor device.

In accordance with an embodiment of the present disclosure, a semiconductor device includes: a cell stack structure including first cell stack layers and stack conductive layers, which are alternately stacked; a dummy stack structure including first dummy stack layers and second dummy stack layers, which are alternately stacked; a cell plug penetrating the cell stack structure; and a cell chip guard penetrating the dummy stack structure, the cell chip guard surrounding the cell stack structure and the cell plug, wherein a level of a bottom surface of a cell chip guard is substantially equal to that of a bottom surface of the cell plug.

In accordance with another embodiment of the present disclosure, a semiconductor device includes: a cell stack structure including stack conductive layers and first cell stack layers, which are alternately stacked; a dummy stack structure including first dummy stack layers and second dummy stack layers, which are alternately stacked; a cell plug penetrating the cell stack structure; and guard plugs penetrating a lower portion of the dummy stack structure, the guard plugs surrounding the cell stack structure and the cell plug, wherein a level of bottom surfaces of the guard plugs is substantially equal to that of a bottom surface of the cell plug.

In accordance with still another embodiment of the present disclosure, a semiconductor device includes: a cell stack structure including first cell stack layers and stack conductive layers, which are alternately stacked; a dummy stack structure including first dummy stack layers and second dummy stack layers, which are alternately stacked; a cell plug penetrating the cell stack structure; and a cell chip guard penetrating the dummy stack structure, the cell chip guard surrounding the cell stack structure and the cell plug. The cell chip guard includes a first cell guard part penetrating a lower portion of the dummy stack structure and a second cell guard part penetrating an upper portion of the dummy stack structure. The cell plug includes an upper portion and a lower portion. A level of a boundary between the upper portion and the lower portion of the cell plug is equal to that of a boundary between the first and second cell guard parts.

In accordance with still another embodiment of the present disclosure, a method of manufacturing a semiconductor device includes: forming first cell stack layers and second cell stack layers, which are alternately stacked, and first dummy stack layers and second dummy stack layers, which are alternately stacked; simultaneously forming a first cell hole penetrating the first and second cell stack layers and a first guard trench penetrating the first and second dummy stack layers, wherein the first guard trench surrounds the first cell hole; simultaneously forming a cell sacrificial structure in the first cell hole and a first cell guard part in the first guard trench; removing the cell sacrificial structure; and forming a cell plug in the first cell hole.

In accordance with still another embodiment of the present disclosure, a method of manufacturing a semiconductor device includes: forming first cell stack layers and second cell stack layers, which are alternately stacked, and first dummy stack layers and second dummy stack layers, which are alternately stacked; simultaneously forming a first cell hole penetrating the first and second cell stack layers and guard holes penetrating the first and second dummy stack layers, wherein the guard holes surround the first cell hole; simultaneously forming a cell sacrificial structure in the first cell hole and guard plugs in the guard holes; removing the cell sacrificial structure; and forming a cell plug in the first cell hole.

BRIEF DESCRIPTION OF THE DRAWINGS

Example embodiments are described below with reference to the accompanying drawings; however, they may be embodied in different forms and should not be construed as being limited as set forth herein. Rather, these embodiments are provided so that this disclosure will be enabling to those skilled in the art. Other embodiments are also possible.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the disclosure.

FIG. 1A is a plan view of a semiconductor device in accordance with an embodiment of the present disclosure.

DETAILED DESCRIPTION

The specific structural or functional descriptions disclosed herein are merely illustrative for the purpose of describing some embodiments according to the concept of the present disclosure. These embodiments can be implemented in various forms, and should not be construed as limiting other possible embodiments.

Figure 1B:
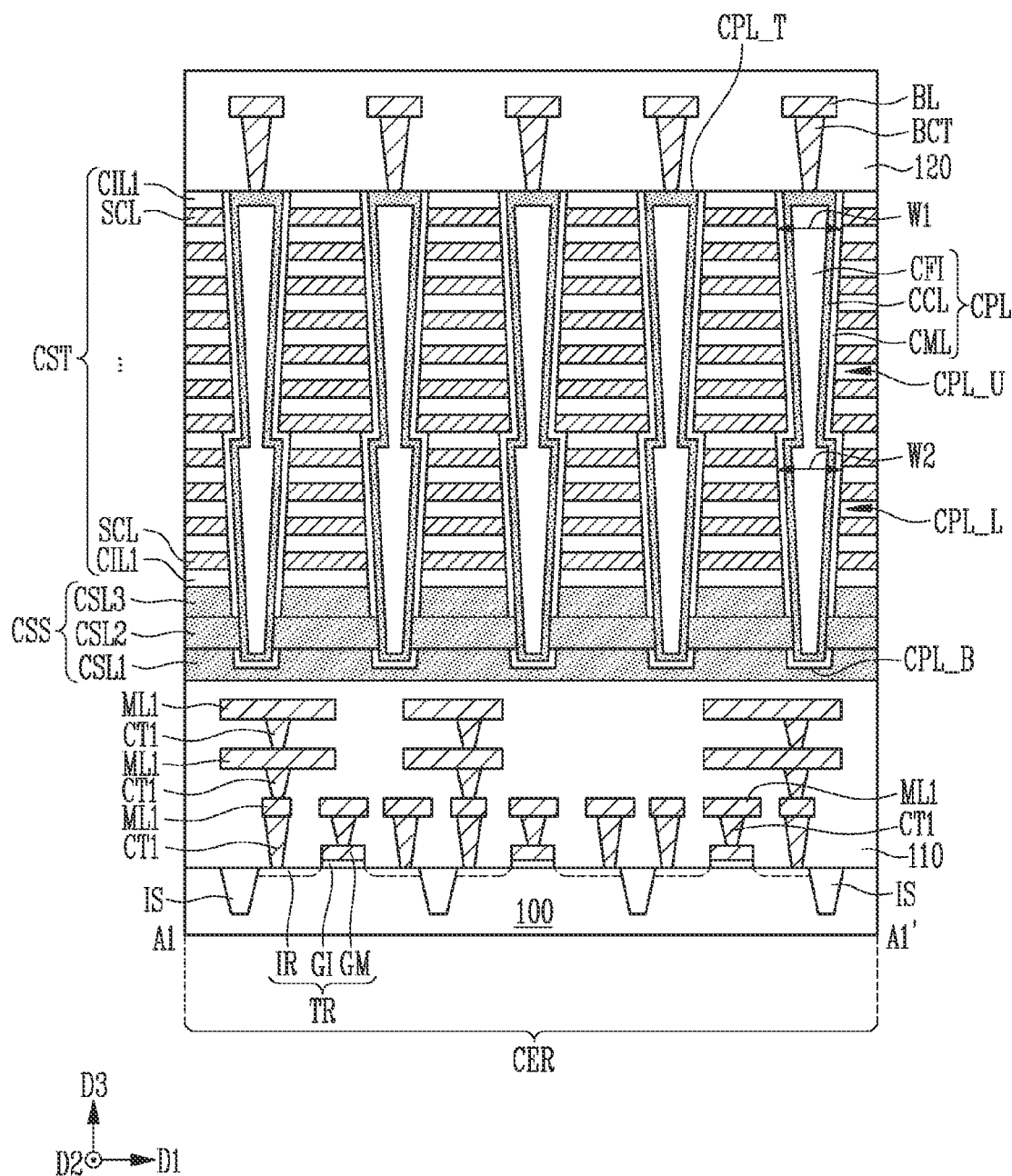
FIG. 1B is a sectional view taken along line A1-A1' shown in FIG. 1A.
Figure 1C:
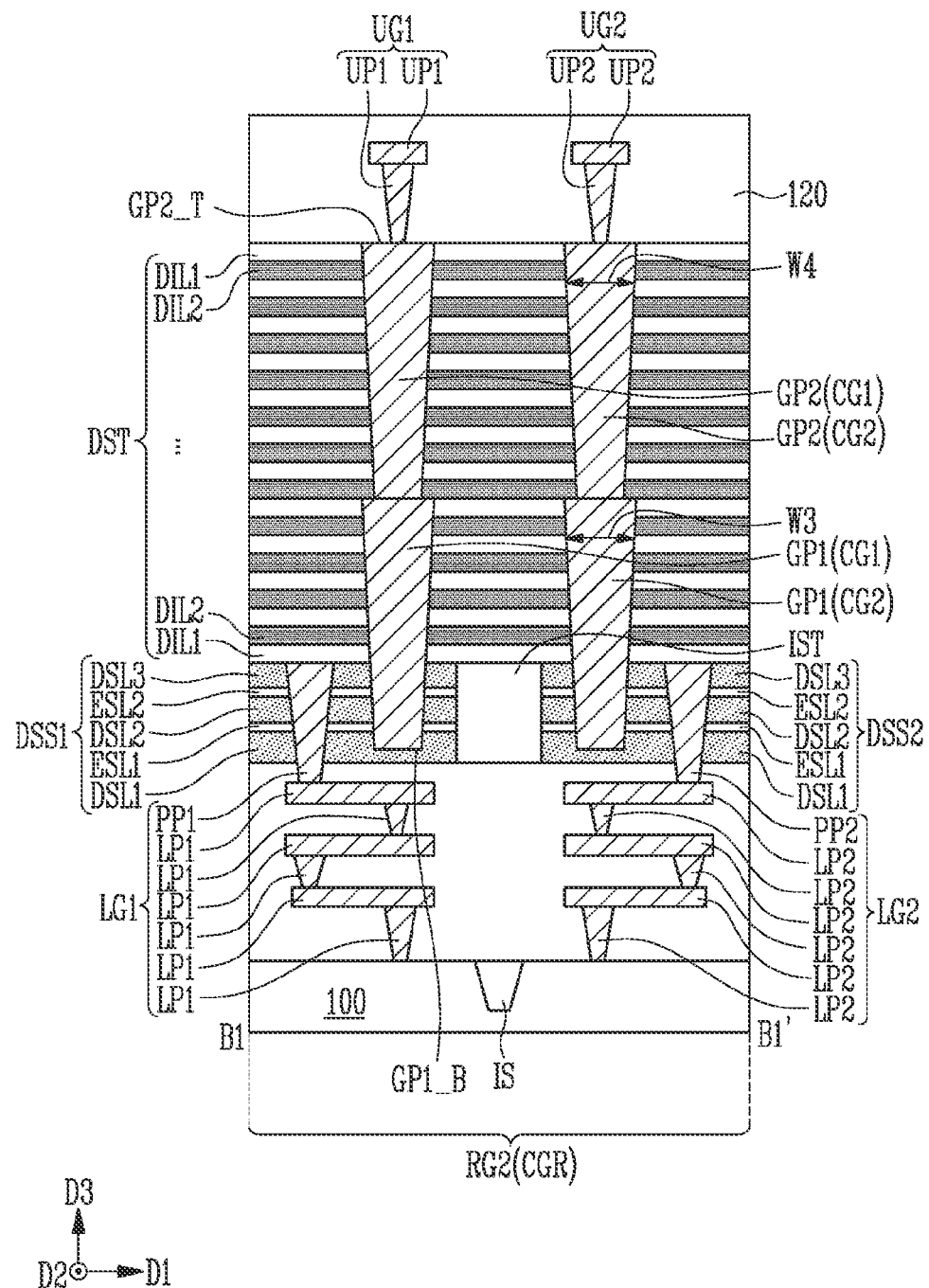
FIG. 1C is a sectional view taken along line B1-B1' shown in FIG. 1A.
Figure 1D:
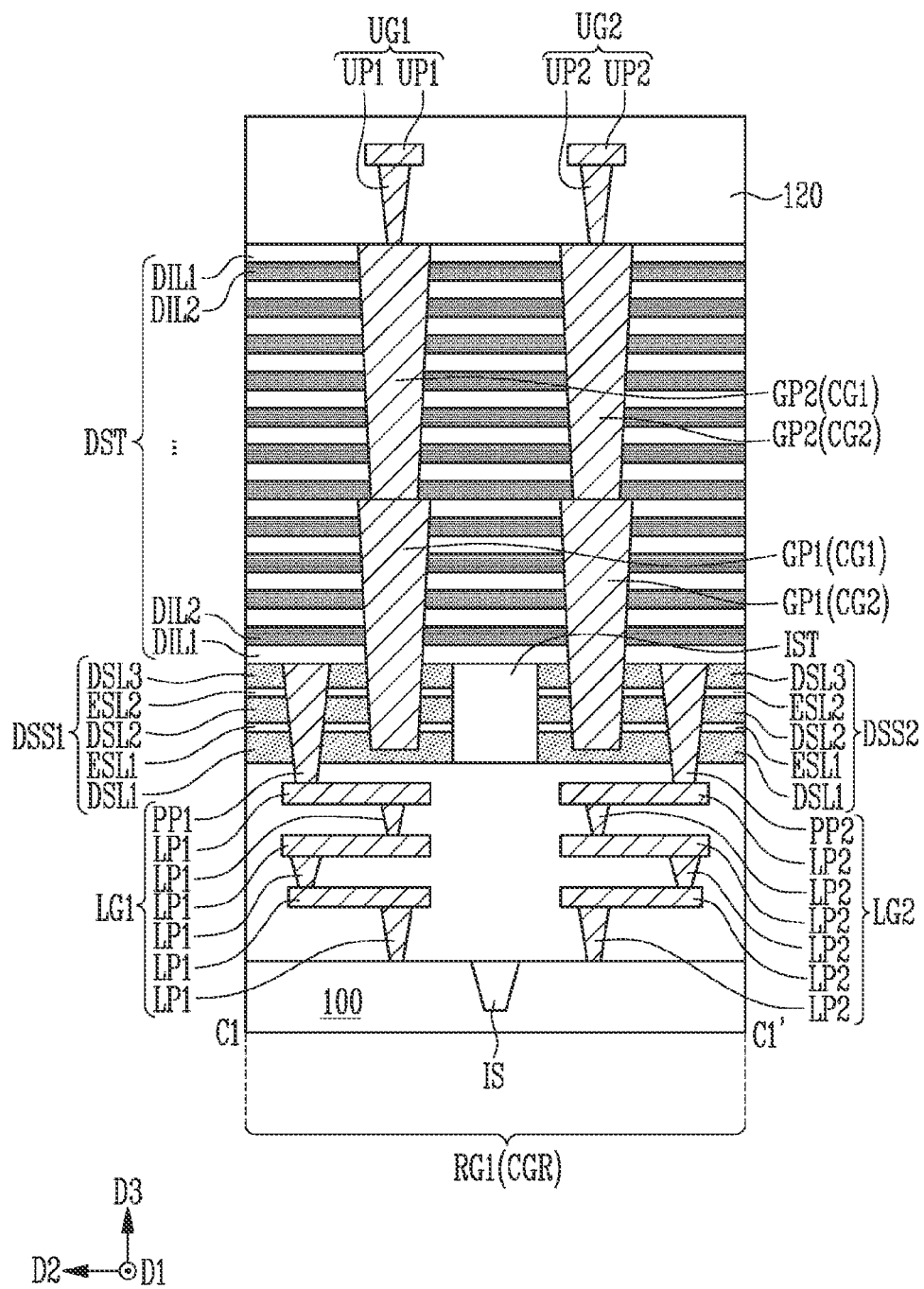
FIG. 1D is a sectional view taken along line C1-C1' shown in FIG. 1A.
Figure 1E:
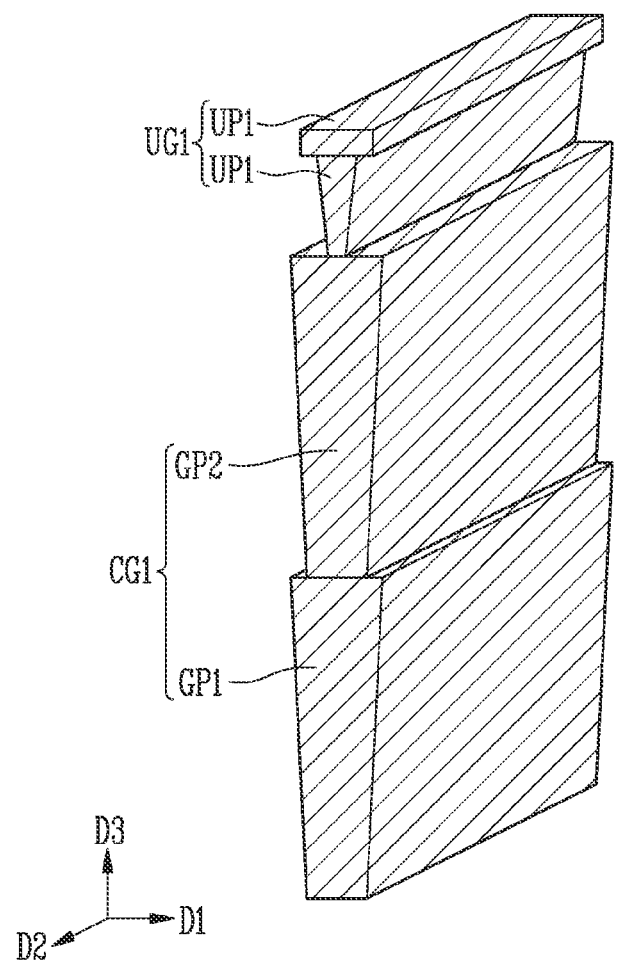
FIG. 1E is a perspective view illustrating a cell chip guard and an upper chip guard of the semiconductor device in accordance with the embodiments shown in FIGS. 1A to 1D.
Figure 1F:
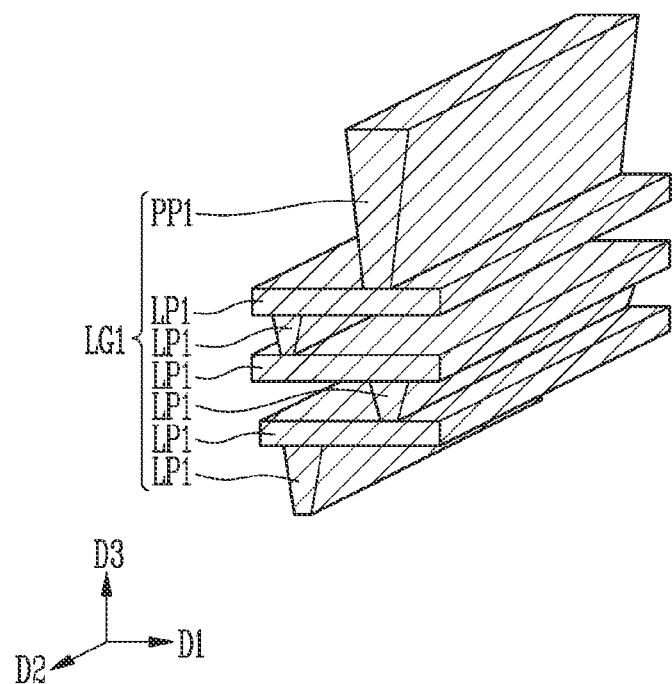
FIG. 1F is a perspective view illustrating a lower chip guard of the semiconductor device in accordance with the embodiments shown in FIGS. 1A to 1D.

FIG. 1A is a plan view of a semiconductor device in accordance with an embodiment of the present disclosure. FIG. 1B is a sectional view taken along line A1-A1' shown in FIG. 1A. FIG. 1C is a sectional view taken along line B1-B1' shown in FIG. 1A. FIG. 1D is a sectional view taken along line C1-C1' shown in FIG. 1A. FIG. 1E is a perspective view illustrating a cell chip guard and an upper chip guard of the semiconductor device in accordance with the embodiments shown in FIGS. 1A to 1D. FIG. 1F is a perspective view illustrating a lower chip guard of the semiconductor device in accordance with the embodiments shown in FIGS. 1A to 1D.

Referring to FIGS. 1A to 1D, the semiconductor device may include a substrate 100. The substrate 100 may have the shape of a plate expanding along a plane defined by a first direction D1 and a second direction D2. The first direction D1 and the second direction D2 may intersect each other. In an example, the first direction D1 and the second direction D2 may be orthogonal to each other. The substrate 100 may be a semiconductor substrate. In an example, the substrate 100 may be a silicon substrate.

The substrate 100 may include a cell region CER and a chip guard region CGR. The cell region CER and the chip guard region CGR may be regions distinguished from each other on a plane. The chip guard region CGR may surround the cell region CER.

The chip guard region CGR may include first regions RG1 and second regions RG2. The first regions RG1 may extend in the first direction D1. The second regions RG2 may extend in the second direction D2. The first regions RG1 may be spaced apart from each other in the second direction D2. The cell region CER may be disposed between the first regions RG1. The second regions RG2 may be spaced apart from each other in the first direction D1. The cell region CER may be disposed between the second regions RG2.

A first insulating layer 110 may be provided, which covers the substrate 100. The first insulating layer 110 may include an insulating material. In an example, the first insulating layer 110 may include an oxide or nitride. The first insulating layer 110 may be a multi-layer including a plurality of insulating layers.

Peripheral transistors TR may be provided between the substrate 100 and the first insulating layer 110. The peripheral transistors TR may be disposed on the cell region CER of the substrate 100. The peripheral transistors TR may constitute a peripheral circuit of the semiconductor device, or be transistors connected to the peripheral circuit of the semiconductor device.

Each of the peripheral transistors TR may include impurity regions IR, a gate insulating layer GI, and a gate electrode GM. The impurity regions IR of the peripheral transistor TR may be spaced apart from each other with the gate insulating layer GI interposed therebetween. A channel of the peripheral transistor TR may be disposed between the impurity regions IR. The gate electrode GM may be spaced apart from the channel of the peripheral transistor TR by the gate insulating layer GI. The impurity regions IR may be formed by doping an impurity into the substrate 100. The gate insulating layer GI may include an insulating material. In an example, the gate insulating layer GI may include an oxide. The gate electrode GM may include a conductive material. In an example, the gate electrode GM may include tungsten.

Isolation layers IS may be provided in the substrate 100. The isolation layers IS may electrically isolate regions of the substrate 100 from each other. The isolation layers IS may include an insulating material. In an example, the isolation layers IS may include an oxide.

First contacts CT1 and first lines ML1 may be provided in the first insulating layer 110. The first contacts CT1 and the first lines ML1 may be provided on the cell region CER of the substrate 100. Each of the first contacts CT1 may connect the peripheral transistor TR and the first line ML1 to each other, and connect the first lines ML1 to each other. The first line ML1 may be connected to the first contact CT1. The first contacts CT1 and the first lines ML1 may include a conductive material. In an example, the first contacts CT1 and the first lines ML1 may include tungsten.

A cell source structure CSS, a first dummy source structure DSS1, and a second dummy source structure DSS2 may be provided on the first insulating layer 110. The cell source structure CSS may be provided on the cell region CER of the substrate 100. The first dummy source structure DSS1 and the second dummy source structure DSS2 may be provided on the chip guard region CGR of the substrate 100. The first dummy source structure DSS1 may surround the cell source structure CSS. The second dummy source structure DSS2 may surround the cell source structure CSS and the first dummy source structure DSS1.

The cell source structure CSS may include a first cell source layer CSL1, a second cell source layer CSL2, and a third cell source layer CSL3, which are sequentially stacked in a third direction D3. The third direction D3 may be a direction intersecting the first direction D1 and the second direction D2. In an example, the third direction D3 may be a direction orthogonal to the first direction D1 and the second direction D2. The second cell source layer CSL2 may be disposed on the first cell source layer CSL1, and the third cell source layer CSL3 may be disposed on the second cell source layer CSL2. The first to third cell source layers CSL1, CSL2, and CSL3 may include a conductive material. In an example, the first to third cell source layers CSL1, CSL2, and CSL3 may include doped poly-silicon.

Each of the first dummy source structure DSS1 and the second dummy source structure DSS2 may include a first dummy source layer DSL1, a first etch stop layer ESL1, a second dummy source layer DSL2, a second etch stop layer ESL2, and a third dummy source layer DSL3, which are sequentially stacked in the third direction D3. The first etch stop layer ESL1 may be disposed on the first dummy source layer DSL1. The second dummy source layer DSL2 may be disposed on the first etch stop layer ESL1, and the second etch stop layer ESL2 may be disposed on the second dummy source layer DSL2. The third dummy source layer DSL3 may be disposed on the second etch stop layer ESL2.

The first dummy source layer DSL1 may be disposed at the same level as the first cell source layer CSL1. The third dummy source layer DSL3 may be disposed at the same level as the third cell source layer CSL3. The same level meaning, for example, the same height with reference to the D3 direction. The first to third dummy source layers DSL1, DSL2, and DSL3 may include a semiconductor material. In an example, the first to third dummy source layers DSL1, DSL2, and DSL3 may include poly-silicon. The first and second etch stop layers ESL1 and ESL2 may include a material having an etch selectivity with respect to that which the first to third dummy source layers DSL1, DSL2, and DSL3 include. In an example, the first and second etch stop layers ESL1 and ESL2 may include an oxide.

Although two dummy source structures DSS1 and DSS2 are illustrated and described, the number of the dummy source structures is not limited to two. For example, the number of dummy source structures may be one or be three or more.

An insulating structure IST may be provided between the first and second dummy source structures DSS1 and DSS2. The insulating structure IST may be disposed on the chip guard region CGR of the substrate 100. The first and second dummy source structures DSS1 and DSS2 may be spaced apart from each other by the insulating structure IST. The insulating structure IST may include an insulating material. In an example, the insulating structure IST may include an oxide.

A first lower chip guard LG1 may be provided in the first insulating layer 110 and the first dummy source structure DSS1. A second lower chip guard LG2 may be provided in the first insulating layer 110 and the second dummy source structure DSS2. The first and second lower chip guards LG1 and LG2 may be disposed on the chip guard region CGR of the substrate 100. Although two lower chip guards LG1 and LG2 are illustrated and described, the number of the lower chip guards is not limited to two. For example, the number of lower chip guards may be one or be three or more. The first and second lower chip guards LG1 and LG2 will be described later.

A cell stack structure CST may be provided on the cell source structure CSS. The cell stack structure CST may be provided on the cell region CER of the substrate 100. The cell stack structure CST may include stack conductive layers SCL and first cell stack layers CIL1, which are alternately stacked in the third direction D3. The stack conductive layers SCL may be used as word lines or select lines of the semiconductor device. The stack conductive layers SCL may include a conductive material. In an example, the stack conductive layers SCL may include tungsten. The first cell stack layers CIL1 may include an insulating material. In an example, the first cell stack layers CIL1 may include an oxide.

Cell plugs CPL may be provided, which penetrate the cell stack structure CST. The cell plugs CPL may be provided on the cell region CER of the substrate 100. The cell plugs CPL may extend in the third direction D3. The cell plug CPL may include a cell filling layer CFI, a cell channel layer CCL surrounding the cell filling layer CFI, and a cell memory layer CML surrounding the cell channel layer CCL. The cell filling layer CFI, the cell channel layer CCL, and the cell memory layer CML may penetrate the cell stack structure CST while extending in the third direction D3.

The cell filling layer CFI may include an insulating material. In an example, the cell filling layer CFI may include an oxide. The cell channel layer CCL may include a semiconductor material. In an example, the cell channel layer CCL may include poly-silicon. The cell memory layer CML may include a tunnel insulating layer surrounding the cell channel layer CCL, a data storage layer surrounding the tunnel insulating layer, and a blocking layer surrounding the data storage layer. The tunnel insulating layer may include a material through which charges can tunnel. In an example, the tunnel insulating layer may include an oxide. In an embodiment, the data storage layer may include a material in which charges can be trapped. In an example, the data storage layer may include a nitride. In another embodiment, the data storage layer may include various materials according to a data storage method. In an example, the data storage layer may include silicon, a phase change material, or nano dots. The blocking layer may include a material capable of blocking the movement of charges. In an example, the blocking layer may include an oxide.

The cell plug CPL may penetrate the second cell source layer CSL2 and the third cell source layer CSL3 of the cell source structure CSS. The cell plug CPL may be connected to the second cell source layer CSL2. The cell channel layer CCL of the cell plug CPL may be in contact with the second cell source layer CSL2. The cell channel layer CCL of the cell plug CPL may be electrically connected to the second cell source layer CSL2.

The cell plug CPL may include an upper portion CPL_U and a lower portion CPL_L. The upper portion CPL_U of the cell plug CPL may penetrate an upper portion of the cell stack structure CST. The lower portion CPL_L of the cell plug CPL may penetrate a lower portion of the cell stack structure CST. A width of the upper portion CPL_U of the cell plug CPL may become smaller with decreasing distance to the substrate 100. In an example, a width of the upper portion CPL_U of the cell plug CPL in the first direction D1 may be defined as a first width W1, and the first width W1 may become smaller with closer proximity to the substrate 100. A width of the lower portion CPL_L of the cell plug CPL may become smaller with decreasing distance to the substrate 100. In an example, a width of the lower portion CPL_L of the cell plug CPL in the first direction D1 may be defined as a second width W2, and the second width W2 may become smaller with closer proximity to the substrate 100. A maximum width of the lower portion CPL_L of the cell plug CPL may be greater than a minimum width of the upper portion CPL_U of the cell plug CPL. In an example, a maximum value of the second width W2 may be greater than a minimum value of the first width W1.

A dummy stack structure DST may be provided on the first dummy source structure DSS1, the second dummy source structure DSS2, and the insulating structure IST. The dummy stack structure DST may be disposed on the chip guard region CGR of the substrate 100. The dummy stack structure DST may surround the cell stack structure CST. The dummy stack structure DST may include first dummy stack layers DIL1 and second dummy stack layers DIL2, which are alternately stacked in the third direction D3. The first dummy stack layers DIL1 may include an insulating material. In an example, the first dummy stack layers DIL1 may include an oxide. The second dummy stack layers DIL2 may include an insulating material different from that of the first dummy stack layers DIL1. In an example, the second dummy stack layers DIL2 may include a nitride. The first dummy stack layer DIL1 may be connected to the first cell stack layer CIL1 without any boundary. In other words, the first dummy stack layer DIL1 and the first cell stack layer CIL1 may be integrally formed.

A first cell chip guard CG1 and a second cell chip guard CG2 may be provided, which penetrate the dummy stack structure DST. The first and second cell chip guards CG1 and CG2 may be disposed on the chip guard region CGR of the substrate 100. Although two cell chip guards CG1 and CG2 are illustrated and described, the number of the cell chip guards CG1 and CG2 is not limited to two. For example, the number of cell chip guards may be one or be three or more. The first and second cell chip guards CG1 and CG2 will be described later.

A second insulating layer 120 may be provided, which covers the cell stack structure CST and the dummy stack structure DST. The second insulating layer 120 may include an insulating material. In an example, the second insulating layer 120 may include an oxide or nitride. The second insulating layer 120 may be a multi-layer including a plurality of insulating layers.

Bit line contacts BCT and bit lines BL may be provided in the second insulating layer 120. The bit line contacts BCT and the bit lines BL may be disposed on the cell region CER of the substrate 100. The bit line contact BCT may connect the cell channel layer CCL of the cell plug CPL to the bit line BL. The bit line BL may extend in the second direction D2. The bit lines BL may be spaced apart from each other in the first direction D1. The bit line contacts BCT and the bit lines BL may include a conductive material. In an example, the bit line contacts BCT and the bit lines BL may include tungsten.

A first upper chip guard UG1 and a second upper chip guard UG2 may be provided in the second insulating layer 120. The first upper chip guard UG1 and the second upper chip guard UG2 may be disposed on the chip guard region CGR of the substrate 100. Although two upper chip guards UG1 and UG2 are illustrated and described, the number of the upper chip guards is not limited to two. In an example, the number of upper chip guards may be one or be three or more. The first and second upper chip guards UG1 and UG2 will be described later.

Referring to FIGS. 1A to 1F, the first lower chip guard LG1 may surround the first contacts CT1, the first lines ML1, and the cell source structure CSS. The second lower chip guard LG2 may surround the first contacts CT1, the first lines ML1, the cell source structure CSS, and the first lower chip guard LG1.

The first lower chip guard LG1 may include first parts extending in the first direction D1 (see FIG. 1D and the first region RG1 of FIG. 1A) and second parts extending in the second direction D2 (see FIG. 1C and the second region RG2 of FIG. 1A). The first parts of the first lower chip guard LG1 may be spaced apart from each other in the second direction D2. The second parts of the first lower chip guard LG1 may be spaced apart from each other in the first direction D1. The first part of the first lower chip guard LG1 may be disposed on the first region RG1 of the substrate 100. The second part of the first lower chip guard LG1 may be disposed on the second region RG2 of the substrate 100. The first contacts CT1, the first lines ML1, and the cell source structure CSS may be disposed between the first parts of the first lower chip guard LG1. The first contacts CT1, the first lines ML1, and the cell source structure CSS may be disposed between the second parts of the first lower chip guard LG1. The first parts and the second parts of the first lower chip guard LG1 may be connected to each other. The first contacts CT1, the first lines ML1, and the cell source structure CSS may be surrounded by the first parts and the second parts of the first lower chip guard LG1.

The first lower chip guard LG1 may include first lower guard parts LP1 and a first penetration guard part PP1. The first lower guard parts LP1 and the first penetration guard part PP1 may be sequentially disposed along the third direction D3. The first lower guard parts LP1 and the first penetration guard part PP1 may be connected to each other.

The first penetration guard part PP1 may penetrate the first dummy source structure DSS1. A level of a top surface of the first penetration guard part PP1 may be equal to that of a top surface of the first dummy source structure DSS1. The first penetration guard part PP1 may surround the cell source structure CSS. The first lower guard parts LP1 may be disposed in the first insulating layer 110. The first lower guard parts LP1 may surround the first contacts CT1 and the first lines ML1.

Each of the first lower guard part LP1 and the first penetration guard part PP1 may include first parts extending in the first direction D1 (see FIG. 1D and the first region RG1 of FIG. 1A) and second parts extending in the second direction D2 (see FIG. 1C and the second region RG2 of FIG. 1A). The first part of each of the first lower guard part LP1 and the first penetration guard part PP1 may be disposed on the first region RG1 of the substrate 100. The second part of each of the first lower guard part LP1 and the first penetration guard part PP1 may be disposed on the second region RG2 of the substrate 100. The first parts of each of the first lower guard part LP1 and the first penetration guard part PP1 may be spaced apart from each other in the second direction D2. The second parts of each of the first lower guard part LP1 and the first penetration guard part PP1 may be spaced apart from each other in the first direction D1. The first parts and the second parts of each of the first lower guard part LP1 and the first penetration guard part PP1 may be connected to each other.

The first lower guard parts LP1 and the first penetration guard part PP1 may include a conductive material. In an example, the first lower guard parts LP1 and the first penetration guard part PP1 may include tungsten.

The second lower chip guard LG2 may include first parts extending in the first direction D1 (see FIG. 1D and the first region RG1 of FIG. 1A) and second parts extending in the second direction D2 (see FIG. 1C and the second region RG2 of FIG. 1A). The first parts of the second lower chip guard LG2 may be spaced apart from each other in the second direction D2. The second parts of the second lower chip guard LG2 may be spaced apart from each other in the first direction D1. The first part of the second lower chip guard LG2 may be disposed on the first region RG1 of the substrate 100. The second part of the second lower chip guard LG2 may be disposed on the second region RG2 of the substrate 100. The first contacts CT1, the first lines ML1, the cell source structure CSS, and the first lower chip guard LG1 may be disposed between the first parts of the second lower chip guard LG2. The first contacts CT1, the first lines ML1, the cell source structure CSS, and the first lower chip guard LG1 may be disposed between the second parts of the second lower chip guard LG2. The first contacts CT1, the first lines ML1, the cell source structure CSS, and the first lower chip guard LG1 may be surrounded by the first parts and the second parts of the second lower chip guard LG2.

The second lower chip guard LG2 may include second lower guard parts LP2 and a second penetration guard part PP2. The second lower guard parts LP2 and the second penetration guard part PP2 may be sequentially disposed along the third direction D3. The second lower guard parts LP2 and the second penetration guard part PP2 may be connected to each other.

The second penetration guard part PP2 may penetrate the second dummy source structure DSS2. A level of a top surface of the second penetration guard part PP2 may be equal to that of a top surface of the second dummy source structure DSS2. The second penetration guard part PP2 may surround the cell source structure CSS and the first penetration guard part PP1. The second lower guard parts LP2 may be disposed in the first insulating layer 110. The second lower guard parts LP2 may surround the first contacts CT1, the first lines ML1, and the first lower guard parts LP1.

Each of the second lower guard parts LP2 and the second penetration guard part PP2 may include first parts extending in the first direction D1 (see FIG. 1D and the first region RG1 of FIG. 1A) and second parts extending in the second direction D2 (see FIG. 1C and the second region RG2 of FIG. 1A). The first part of each of the second lower guard parts LP2 and the second penetration guard part PP2 may be disposed on the first region RG1 of the substrate 100. The second part of each of the second lower guard parts LP2 and the second penetration guard part PP2 may be disposed on the second region RG2 of the substrate 100. The first parts of each of the second lower guard parts LP2 and the second penetration guard part PP2 may be spaced apart from each other in the second direction D2. The second parts of each of the second lower guard parts LP2 and the second penetration guard part PP2 may be spaced apart from each other in the first direction D1. The first parts and the second parts of each of the second lower guard parts LP2 and the second penetration guard part PP2 may be connected to each other.

The second lower guard parts LP2 and the second penetration guard part PP2 may include a conductive material. In an example, the second lower guard parts LP2 and the second penetration guard part PP2 may include tungsten.

Referring to FIG. 1A, the first cell chip guard CG1 may surround the cell stack structure CST and the cell plugs CPL. The second cell chip guard CG2 may surround the cell stack structure CST, the cell plugs CPL, and the first cell chip guard CG1.

The first cell chip guard CG1 may include first cell extension parts CE1 and second cell extension parts CE2. The first cell extension parts CE1 may extend in the first direction D1. The second cell extension parts CE2 may extend in the second direction D2. The first cell extension parts CE1 may be spaced apart from each other in the second direction D2. The second cell extension parts CE2 may be spaced apart from each other in the first direction D1. The cell stack structure CST and the cell plugs CPL may be disposed between the first cell extension parts CE1. The cell stack structure CST and the cell plugs CPL may be disposed between the second cell extension parts CE2. Two first cell extension parts CE1 may be connected to one second cell extension part CE2. Two second cell extension parts CE2 may be connected to one first cell extension part CE1. Each of the first cell extension parts CE1 may be disposed on each of the first regions RG1 of the substrate 100. Each of the second cell extension parts CE2 may be disposed on each of the second regions RG2 of the substrate 100. The cell stack structure CST and the cell plugs CPL may be surrounded by the first cell extension parts CE1 and the second cell extension parts CE2. The first cell chip guard CG1 may penetrate the dummy stack structure DST while extending in the third direction D3.

The second cell chip guard CG2 may include third cell extension parts CE3 and fourth cell extension parts CE4. The third cell extension parts CE3 may extend in the first direction D1. The fourth cell extension parts CE4 may extend in the second direction D2. The third cell extension parts CE3 may be spaced apart from each other in the second direction D2. The fourth cell extension parts CE4 may be spaced apart from each other in the first direction D1. The cell stack structure CST, the cell plugs CPL, and the first cell chip guard CG1 may be disposed between the third cell extension parts CE3. The cell stack structure CST, the cell plugs CPL, and the first cell chip guard CG1 may be disposed between the fourth cell extension parts CE4. Two third cell extension parts CE3 may be connected to one fourth cell extension part CE4. Two fourth cell extension parts CE4 may be connected to one third cell extension part CE3. Each of the third cell extension parts CE3 may be disposed on each of the first regions RG1 of the substrate 100. Each of the fourth cell extension parts CE4 may be disposed on each of the second regions RG2 of the substrate 100. The cell stack structure CST, the cell plugs CPL, and the first cell chip guard CG1 may be surrounded by the third cell extension parts CE3 and the fourth cell extension parts CE4. The second cell chip guard CG2 may penetrate the dummy stack structure DST while extending in the third direction D3.

Each of the first and second cell chip guards CG1 and CG2 may include a first cell guard part GP1 and a second cell guard part GP2. The first and second cell guard parts GP1 and GP2 may penetrate the dummy stack structure DST while extending in the third direction D3. The second cell guard part GP2 may be disposed on the first cell guard part GP1. The second cell guard part GP2 may penetrate an upper portion of the dummy stack structure DST. The first cell guard part GP1 may penetrate a lower portion of the dummy stack structure DST.

A width of the first cell guard part GP1 may become smaller with decreasing distance to the substrate 100. In an example, a width of the first cell guard part GP1 in the first direction D1 may be defined as a third width W3, and the third width W3 may become smaller with closer proximity to the substrate 100. A width of the second cell guard part GP2 may become smaller with decreasing distance to the substrate 100. In an example, a width of the second cell guard part GP2 in the first direction D1 may be defined as a fourth width W4, and the fourth width W4 may become smaller with closer proximity to the substrate 100. A maximum width of the first cell guard part GP1 may be greater than a minimum width of the second cell guard part GP2. In an example, a maximum value of the third width W3 may be greater than a minimum value of the fourth width W4.

The first cell chip guard CG1 and the second cell chip guard CG2 may be disposed at the same level as the cell plugs CPL. The first cell guard parts GP1 of the first and second cell chip guards CG1 and CG2 may be disposed at the same level of the lower portion CPL_L of the cell plug CPL. The second cell guard parts GP2 of the first and second cell chip guards CG1 and CG2 may be disposed at the same level as the upper portion CPL_U of the cell plug CPL.

A level of bottom surfaces GP1_B of the first cell guard parts GP1 of the first and second cell chip guards CG1 and CG2 may be equal to that of a bottom surface CPL_B of the cell plug CPL. A level of top surfaces GP2_T of the second cell guard parts GP2 of the first and second cell chip guards CG1 and CG2 may be equal to that of a top surface CPL_T of the cell plug CPL. A level of a boundary between the first and second cell guard parts GP1 and GP2 may be equal to that of a boundary between the upper portion CPL_U and the lower portion CPL_L of the cell plug CPL.

A lower portion of the first cell guard part GP1 of the first cell chip guard CG1 may be disposed in the first dummy source structure DSS1. The first cell guard part GP1 of the first cell chip guard CG1 may penetrate the first and second etch stop layers ESL1 and ESL2 and second and third dummy source layer DSL2 and DSL3 of the first dummy source structure DSS1.

A lower portion of the first cell guard part GP1 of the second cell chip guard CG2 may be disposed in the second dummy source structure DSS2. The first cell guard part GP1 of the second cell chip guard CG2 may penetrate the first and second etch stop layers ESL1 and ESL2 and second and third dummy source layer DSL2 and DSL3 of the second dummy source structure DSS2.

The lower portion of the first cell guard part GP1 of the first cell chip guard CG1, the lower portion of the first cell guard part GP1 of the second cell chip guard CG2, an upper portion of the first penetration guard part PP1, and an upper portion of the second penetration guard part PP2 may be disposed at the same level.

Each of the first cell guard part GP1 and the second cell guard part GP2 may include first parts extending in the first direction D1 (see FIG. 1D and the first region RG1 of FIG. 1A) and second parts extending in the second direction D2 (see FIG. 1C and the second region RG2 of FIG. 1A). The first part of each of the first cell guard part GP1 and the second cell guard part GP2 may be disposed on the first region RG1 of the substrate 100. The second part of each of the first cell guard part GP1 and the second cell guard part GP2 may be disposed on the second region RG2 of the substrate 100. The first parts of each of the first cell guard part GP1 and the second cell guard part GP2 may be spaced apart from each other in the second direction D2. The second parts of each of the first cell guard part GP1 and the second cell guard part GP2 may be spaced apart from each other in the first direction D1. The first parts and the second parts of each of the first cell guard part GP1 and the second cell guard part GP2 may be connected to each other.

The first and second cell guard parts GP1 and GP2 may include a conductive material. In an example, the first and second cell guard parts GP1 and GP2 may include tungsten.

The first upper chip guard UG1 may surround the bit line contacts BCT and the bit lines BL. The second upper chip guard UG2 may surround the bit line contacts BCT, the bit lines BL, and the first upper chip guard UG1. The first upper chip guard UG1 may be connected to the second cell guard part GP2 of the first cell chip guard CG1. The second upper chip guard UG2 may be connected to the second cell guard part GP2 of the second cell chip guard CG2.

The first upper chip guard UG1 may include first parts extending in the first direction D1 (see FIG. 1D and the first region RG1 of FIG. 1A) and second parts extending in the second direction D2 (see FIG. 1C and the second region RG2 of FIG. 1A). The first parts of the first upper chip guard UG1 may be spaced apart from each other in the second direction D2. The second parts of the first upper chip guard UG1 may be spaced apart from each other in the first direction D1. The first part of the first upper chip guard UG1 may be disposed on the first region RG1 of the substrate 100. The second part of the first upper chip guard UG1 may be disposed on the second region RG2 of the substrate 100. The bit line contacts BCT and the bit lines BL may be disposed between the first parts of the first upper chip guard UG1. The bit line contacts BCT and the bit lines BL may be disposed between the second parts of the first upper chip guard UG1. The first parts and the second parts of the first upper chip guard UG1 may be connected to each other.

The first upper chip guard UG1 may include first upper guard parts UP1. The first upper guard parts UP1 may be sequentially disposed along the third direction D3. The first upper guard parts UP1 may be connected to each other.

The first upper guard parts UP1 may be disposed in the second insulating layer 120. The first upper guard parts UP1 may surround the bit line contacts BCT and the bit lines BL.

Each of the first upper guard parts UP1 may include first parts extending in the first direction D1 (see FIG. 1D and the first region RG1 of FIG. 1A) and second parts extending in the second direction D2 (see FIG. 1C and the second region RG2 of FIG. 1A). The first part of each of the first upper guard parts UP1 may be disposed on the first region RG1 of the substrate 100. The second part of each of the first upper guard parts UP1 may be disposed on the second region RG2 of the substrate 100. The first parts of each of the first upper guard parts UP1 may be spaced apart from each other in the second direction D2. The second parts of each of the first upper guard parts UP1 may be spaced apart from each other in the first direction D1. The first parts and the second parts of each of the first upper guard parts UP1 may be connected to each other.

The first upper guard parts UP1 may include a conductive material. In an example, the first upper guard parts UP1 may include tungsten.

The second upper chip guard UG2 may include first parts extending in the first direction D1 (see FIG. 1D and the first region RG1 of FIG. 1A) and second parts extending in the second direction D2 (see FIG. 1C and the second region RG2 of FIG. 1A). The first parts of the second upper chip guard UG2 may be spaced apart from each other in the second direction D2. The second parts of the second upper chip guard UG2 may be spaced apart from each other in the first direction D1. The first part of the second upper chip guard UG2 may be disposed on the first region RG1 of the substrate 100. The second part of the second upper chip guard UG2 may be disposed on the second region RG2 of the substrate 100. The bit line contacts BCT, the bit lines BL, and the first upper chip guard UG1 may be disposed between the first parts of the second upper chip guard UG2. The bit line contacts BCT, the bit lines BL, and the first upper chip guard UG1 may be disposed between the second parts of the second upper chip guard UG2. The first parts and the second parts of the second upper chip guard UG2 may be connected to each other.

The second upper chip guard UG2 may include second upper guard parts UP2. The second upper guard parts UP2 may be sequentially disposed along the third direction D3. The second upper guard parts UP2 may be connected to each other.

The second upper guard parts UP2 may be disposed in the second insulating layer 120. The second upper guard parts UP2 may surround the bit line contacts BCT, the bit lines BL, and the first upper chip guard UG1.

Each of the second upper guard parts UP2 may include first parts extending in the first direction D1 (see FIG. 1D and the first region RG1 of FIG. 1A) and second parts extending in the second direction D2 (see FIG. 1C and the second region RG2 of FIG. 1A). The first part of each of the second upper guard parts UP2 may be disposed on the first region RG1 of the substrate 100. The second part of each of the second upper guard parts UP2 may be disposed on the second region RG2 of the substrate 100. The first parts of each of the second upper guard parts UP2 may be spaced apart from each other in the second direction D2. The second parts of each of the second upper guard parts UP2 may be spaced apart from each other in the first direction D1. The first parts and the second parts of each of the second upper guard parts UP2 may be connected to each other.

The second upper guard parts UP2 may include a conductive material. In an example, the second upper guard parts UP2 may include tungsten.

In a semiconductor device in accordance with an embodiment of the present disclosure, each of the cell chip guards CG1 and CG2 is formed to be divided into the first cell guard part GP1 and the second cell guard part GP2. Accordingly, widths of the cell chip guards CG1 and CG2 can be relatively small, and a void or crack can be prevented from being formed in the cell chip guards CG1 and CG2.

FIGS. 2A, 2B, 3A, 3B, 4, and 5 are sectional views illustrating a manufacturing method of a semiconductor device in accordance with embodiments of the present disclosure. Hereinafter, repeated descriptions of components already described above are omitted.

Figure 2A:
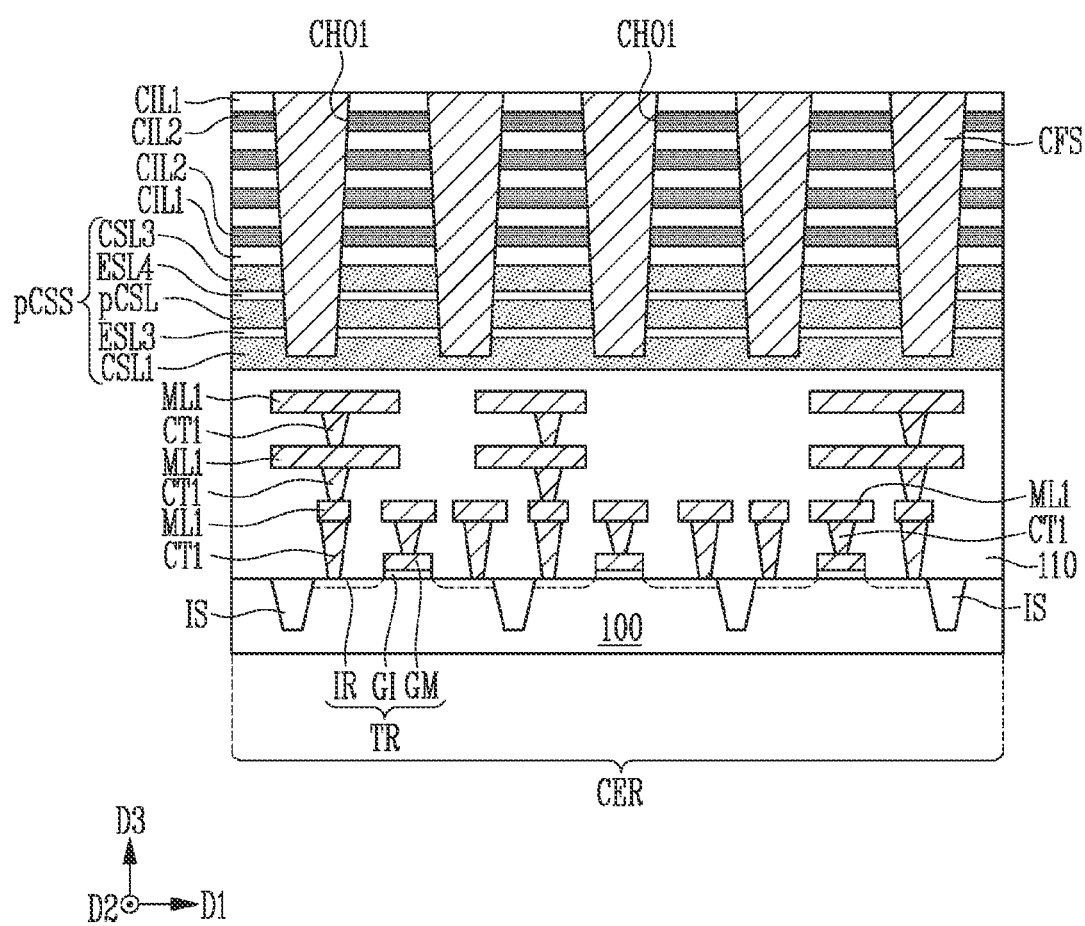
FIGS. 2A, 2B, 3A, 3B, 4, and 5 are sectional views illustrating a manufacturing method of a semiconductor device in accordance with an embodiment of the present disclosure.
Figure 2B:
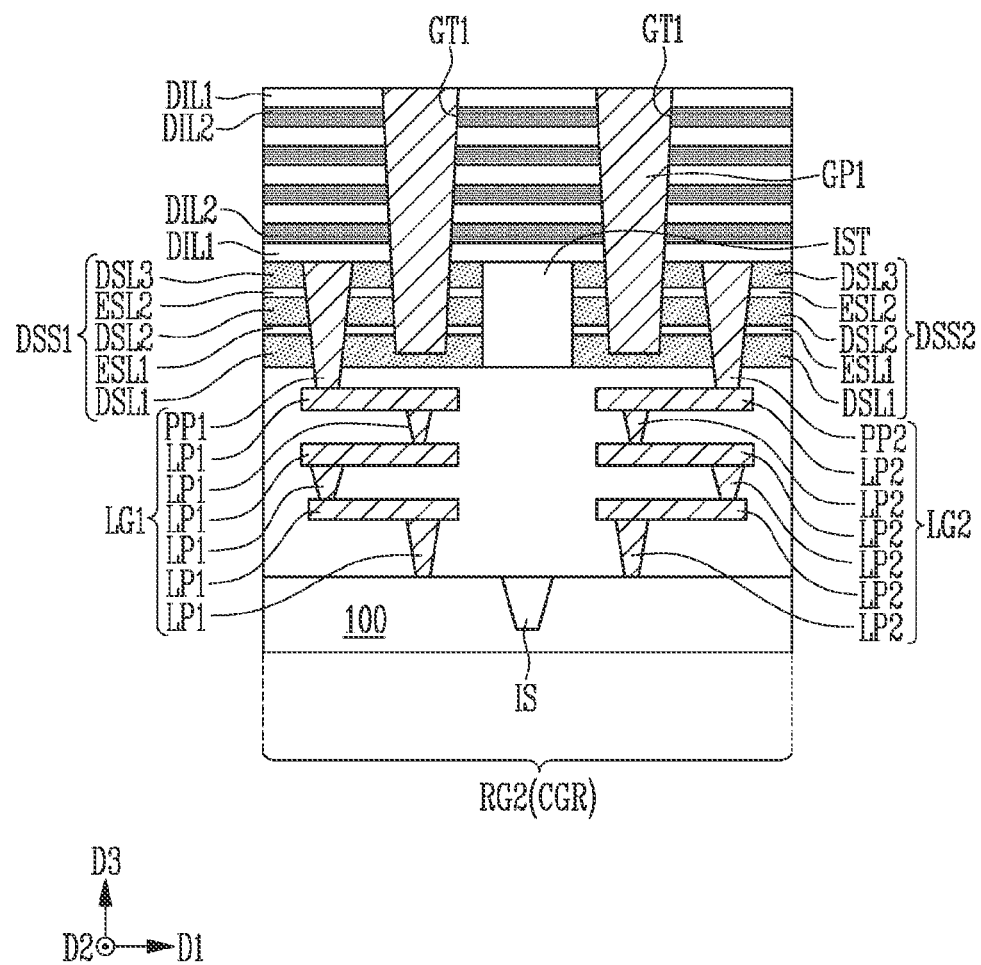

Referring to FIGS. 2A and 2B, a substrate 100 may be formed. Subsequently, isolation layers IS and peripheral transistors TR may be formed on the substrate 100.

A first insulating layer 110 may be formed, which covers the substrate 100 and the peripheral transistors TR. While the first insulating layer 100 is formed, first contacts CT1, first lines ML1, a first lower chip guard LG1, and a second lower chip guard LG2 may be formed.

A preliminary cell source structure pCSS may be formed on the first insulating layer 110. The preliminary cell source structure pCSS may include a first cell source layer CSL1, a third etch stop layer ESL3, a preliminary cell source layer pCSL, a fourth etch stop layer ESL4, and a third cell source layer CSL3, which are sequentially stacked in the third direction D3. The preliminary cell source structure pCSS may be formed on a cell region CER of the substrate 100.

First and second dummy source structures DSS1 and DSS2 may be formed on the first insulating layer 110. An insulating structure IST may be formed on the first insulating layer 110.

First cell stack layers CIL1 and second cell stack layers CIL2 may be alternately formed on the preliminary cell source structure pCSS. The second cell stack layers CIL2 may include an insulating material different from that of the first cell stack layers CIL1. In an example, the second cell stack layers CIL2 may include a nitride. The first cell stack layers CIL1 and the second cell stack layers CIL2 may be formed on the cell region CER of the substrate 100.

First dummy stack layers DIL1 and second dummy stack layers DIL2 may be alternately formed to produce the first and second dummy source structures DSS1 and DSS2. The first dummy stack layers DIL1 and the second dummy stack layers DIL2 may be formed on a chip guard region CGR of the substrate 100.

The first cell stack layer CIL1 and the first dummy stack layer DIL1 may be simultaneously formed. The first cell stack layer CIL1 and the first dummy stack layer DIL1 may be continuously formed without any boundary. The second cell stack layer CIL2 and the second dummy stack layer DIL2 may be simultaneously formed. The second cell stack layer CIL2 and the second dummy stack layer DIL2 may be continuously formed without any boundary. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

First cell guard parts GP1 may be formed, which penetrate the first dummy stack layers DIL1 and the second dummy stack layers DIL2. The forming of the first cell guard parts GP1 may include forming first guard trenches GT1 penetrating the first dummy stack layers DIL1 and the second dummy stack layers DIL2 and forming the first cell guard parts GP1 in the first guard trenches GT1. The first guard trenches GT1 may be simultaneously formed with first cell holes CHO1. The first guard trenches GT1 may be formed at the same level as the first cell holes CHO1. The first guard trenches GT1 may surround the first cell holes CHO1. The first cell guard parts GP1 may surround the first cell holes CHO1. The first cell guard parts GP1 may be simultaneously formed with cell sacrificial structures CFS. The first cell guard parts GP1 may surround the cell sacrificial structures CFS. The first cell guard parts GP1 may include the same material as the cell sacrificial structures CFS. In an example, the first cell guard parts GP1 may include tungsten.

Figure 3A:
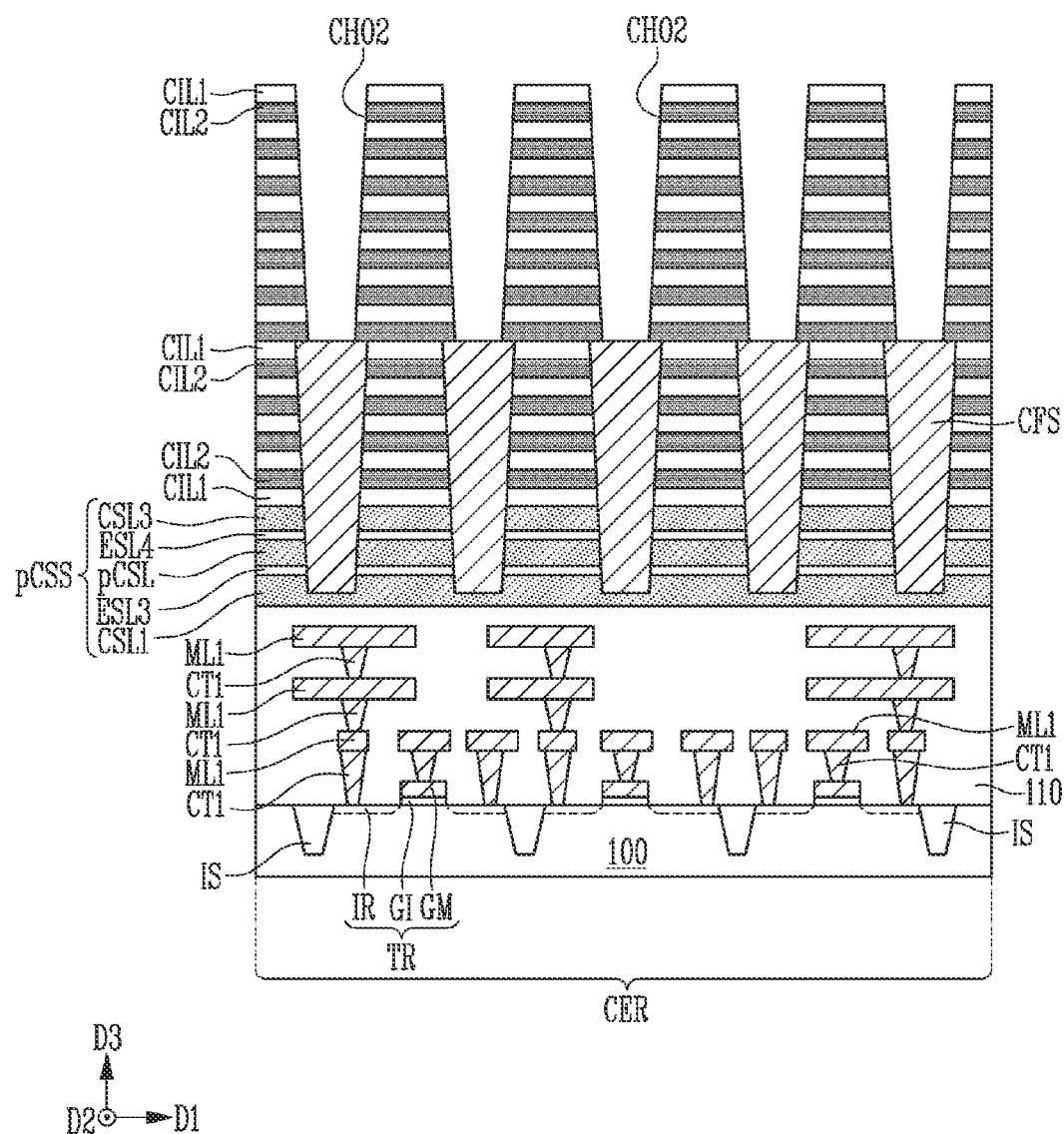
Figure 3B:
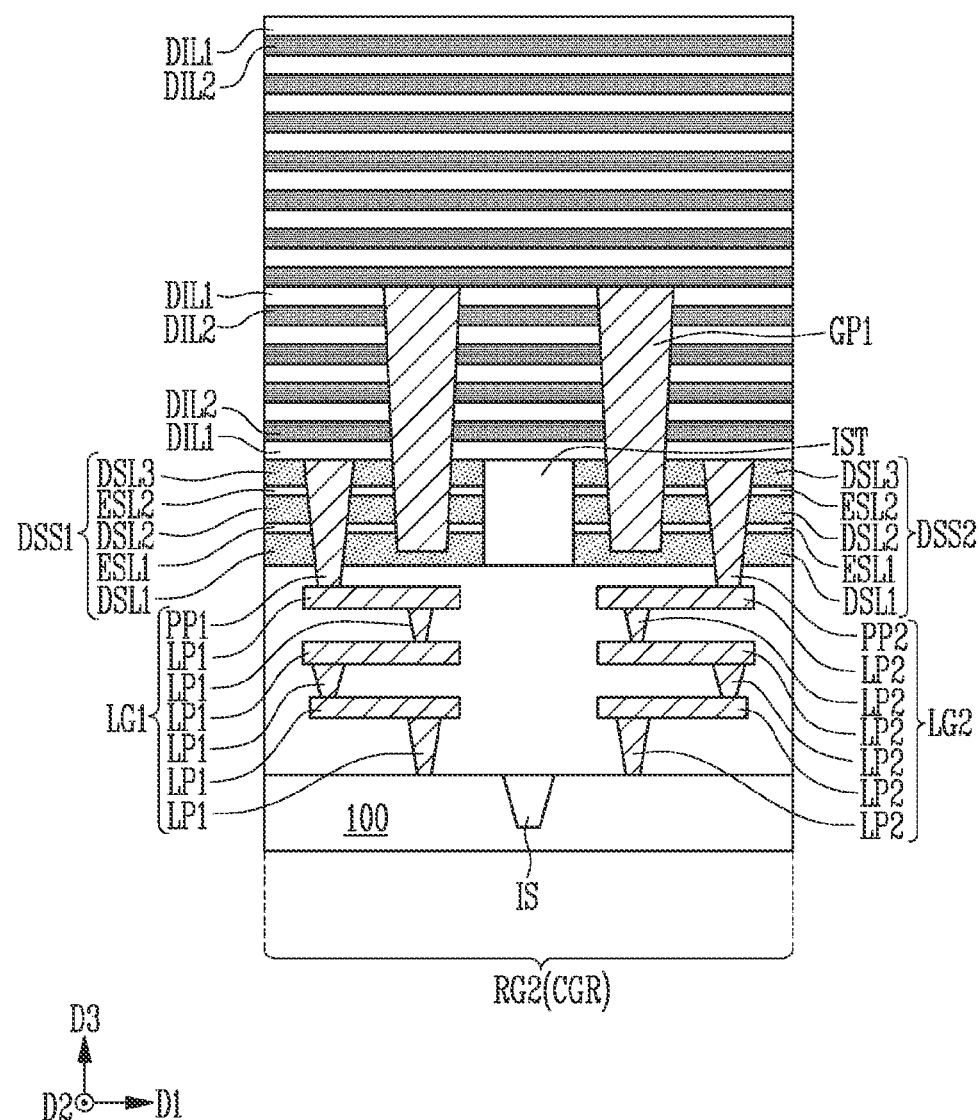

Referring to FIGS. 3A and 3B, first cell stack layers CIL1 and second cell stack layers CIL2 may be alternately formed on the cell sacrificial structures CFS. First dummy stack layers DIL1 and second dummy stack layers DIL2 may be alternately formed on the first cell guard parts GP1.

Subsequently, second cell holes CHO2 may be formed, which penetrate the first cell stack layers CIL1 and the second cell stack layers CIL2 on the cell sacrificial structure CFS. When the second cell holes CHO2 are formed, top surfaces of the cell sacrificial structures CFS may be exposed.

Figure 4:
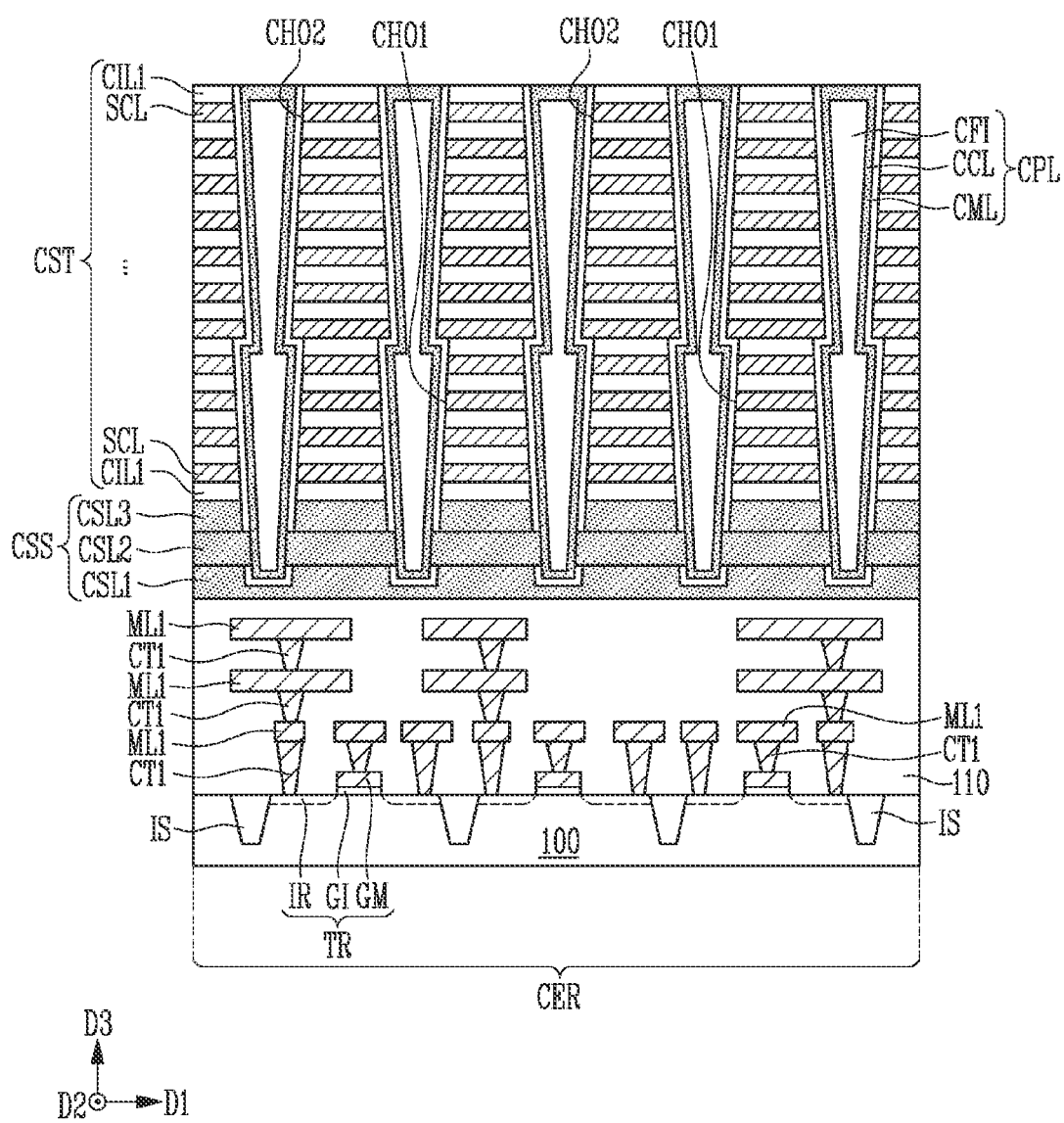

Referring to FIG. 4, cell plugs CPL may be formed. The forming of the cell plugs CPL may include removing the cell sacrificial structures CFS through the second cell holes CHO2 and forming the cell plugs CPL in the first cell holes CHO1 and the second cell holes CHO2.

A cell source structure CSS and stack conductive layers SCL may be formed. The forming of the cell source structure CSS and the stack conductive layers SCL may include forming a slit penetrating a cell stack structure CST, removing the preliminary source layer pCSL, the third etch stop layer ESL3, and the fourth etch stop layer ESL4 through the slit, forming a second cell source layer CSL2 in an empty space in which the preliminary source layer pCSL, the third etch stop layer ESL3, and the fourth etch stop layer ESL4 are removed, removing the second cell stack layers CIL2 through the slit, and forming the stack conductive layers SCL in the empty spaces left when the second cell stack layers CIL2 are removed. When the second cell source layer CSL2 is formed, the preliminary cell source structure pCSS may be defined as the cell source structure CSS.

Figure 5:
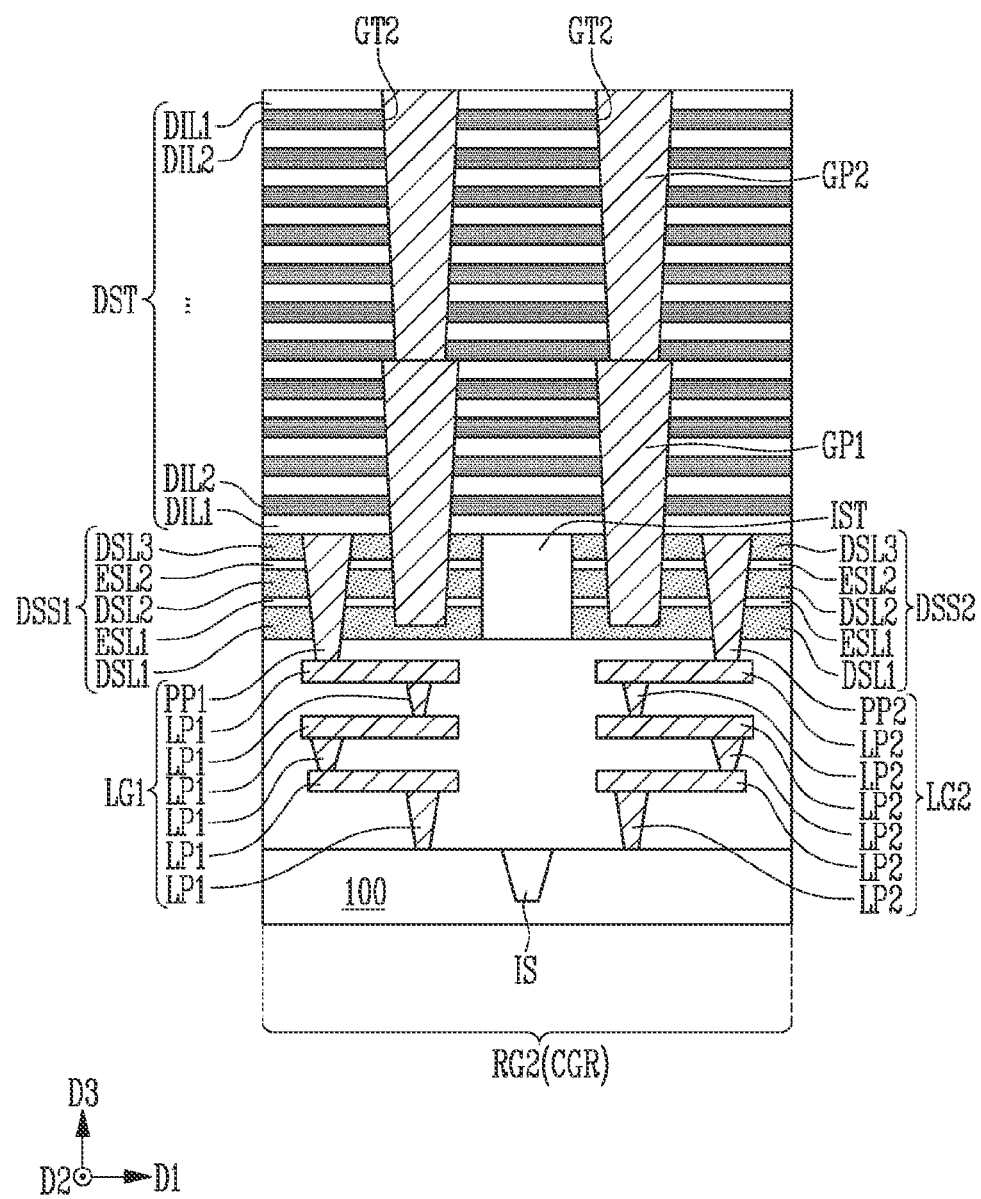

Referring to FIG. 5, second guard trenches GT2 may be formed, which penetrate the first dummy stack layers DIL1 and the second dummy stack layers DIL2 on the first cell guard parts GP1. When the second guard trenches GT2 are formed, top surfaces of the first cell guard parts GP1 may be exposed. The second guard trenches GT2 may surround the second cell holes CHO2.

Second cell guard parts GP2 may be formed in the second guard trenches GT2. The second cell guard parts GP2 may be formed on the top surfaces of the first cell guard parts GP1.

A second insulating layer 120 may be formed, which covers the cell plugs CPL, the cell stack structure CST, the first and second cell chip guards CG1 and CG2, and a dummy stack structure DST (see FIGS. 1B to 1D). Bit line contact BCT, bit lines BL, a first upper chip guard UG1, and a second upper chip guard UG2 may be formed in the second insulating layer 120 (see FIGS. 1B to 1D).

In a manufacturing method of a semiconductor device in accordance with an embodiment of the present disclosure, the cell chip guards CG1 and CG2 are formed in a two-step process by using a first guard trench GT1 and then a second guard trench GT2. Accordingly, widths of the first and second guard trenches GT1 and GT2 can be relatively small, which helps prevent a void or crack from forming in the cell chip guards CG1 and CG2.

In a manufacturing method of a semiconductor device in accordance with an embodiment of the present disclosure, the first cell guard parts of the cell chip guards CG1 and CG2 are simultaneously formed with the cell sacrificial structure CFS. Accordingly, the manufacturing cost and manufacturing time of the semiconductor device can be reduced or minimized.

Figure 6A:
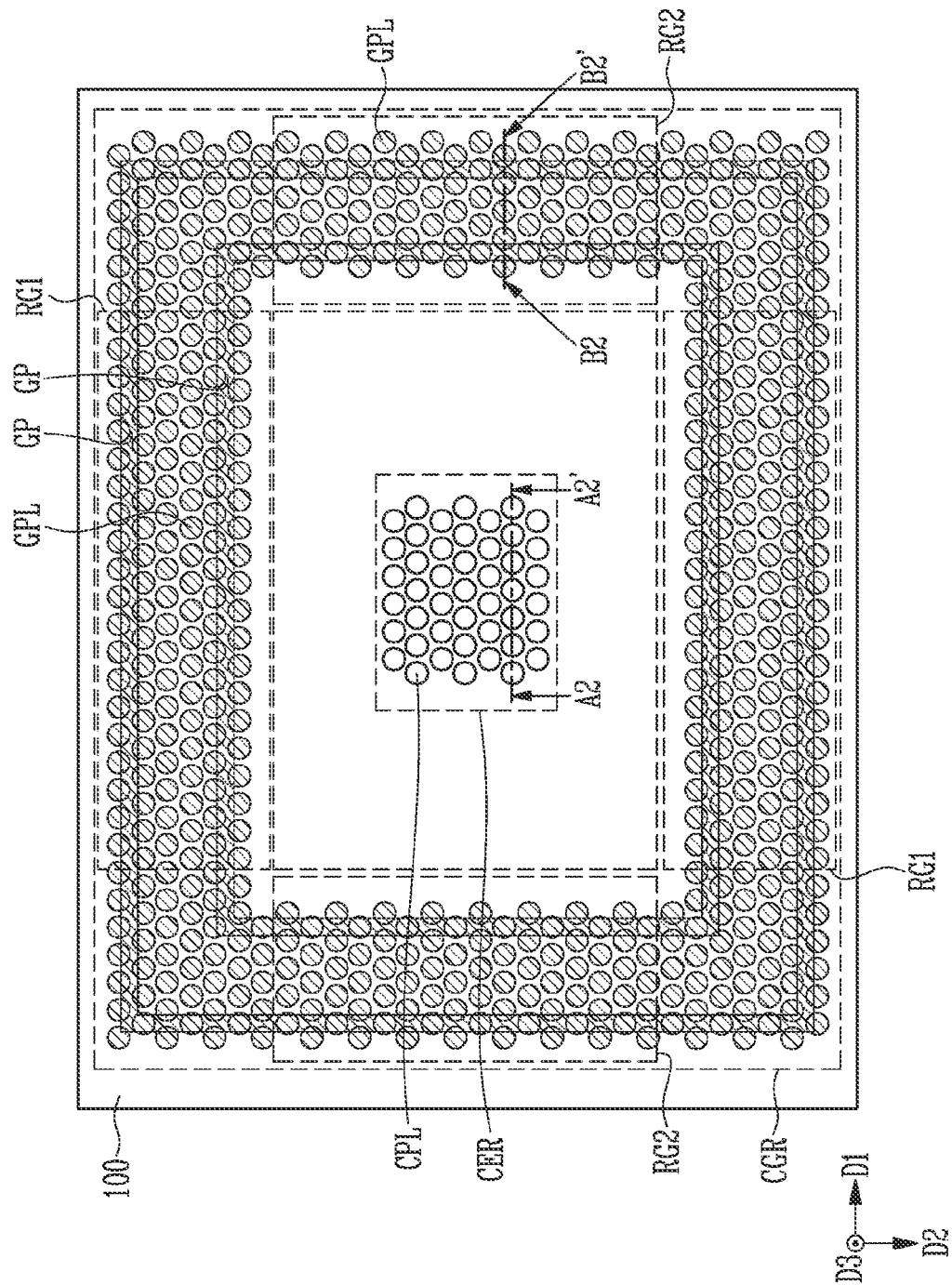
FIG. 6A is a plan view of a semiconductor device in accordance with an embodiment of the present disclosure.
Figure 6B:
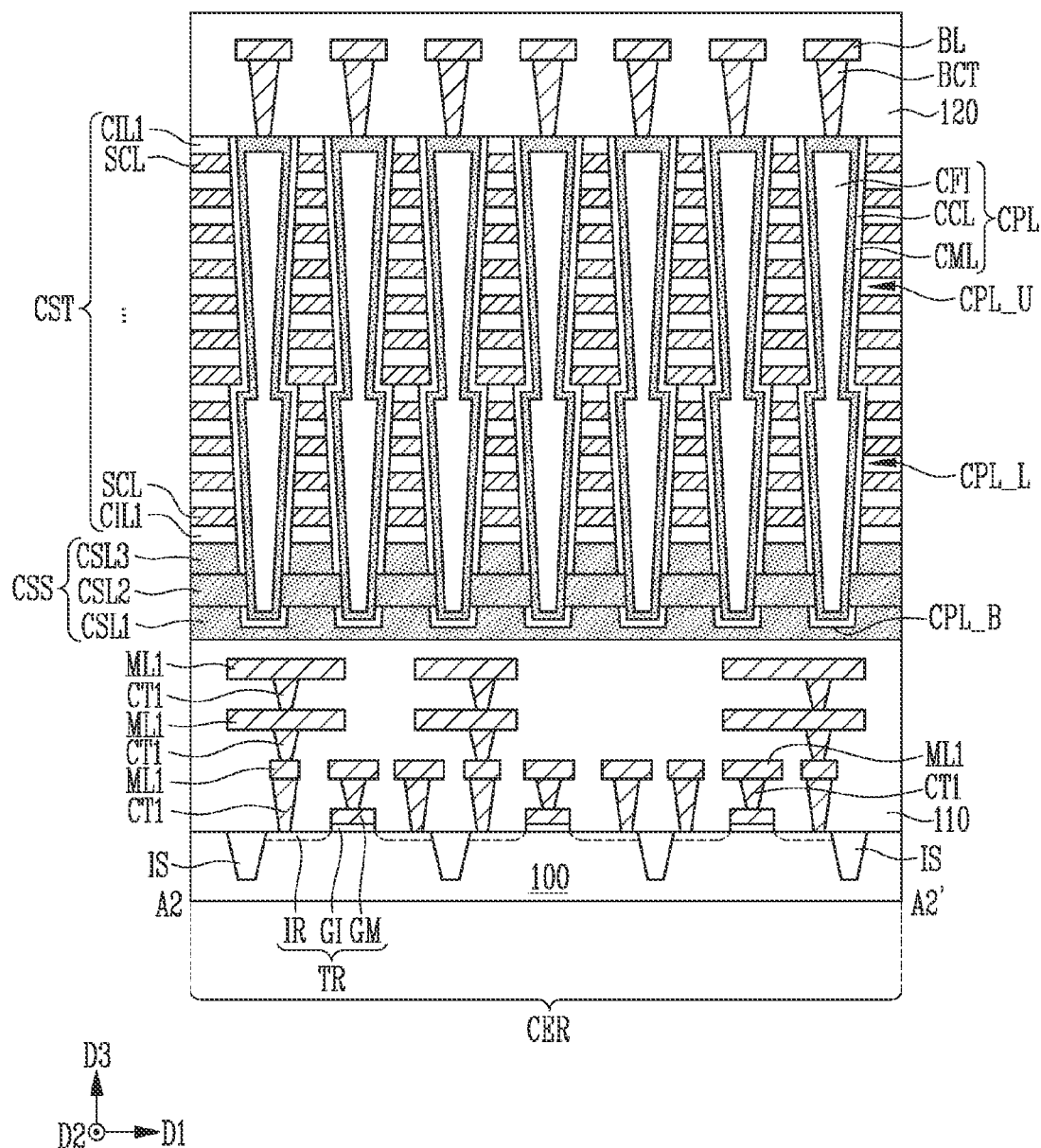
FIG. 6B is a sectional view taken along line A2-A2' shown in FIG. 6A.
Figure 6C:
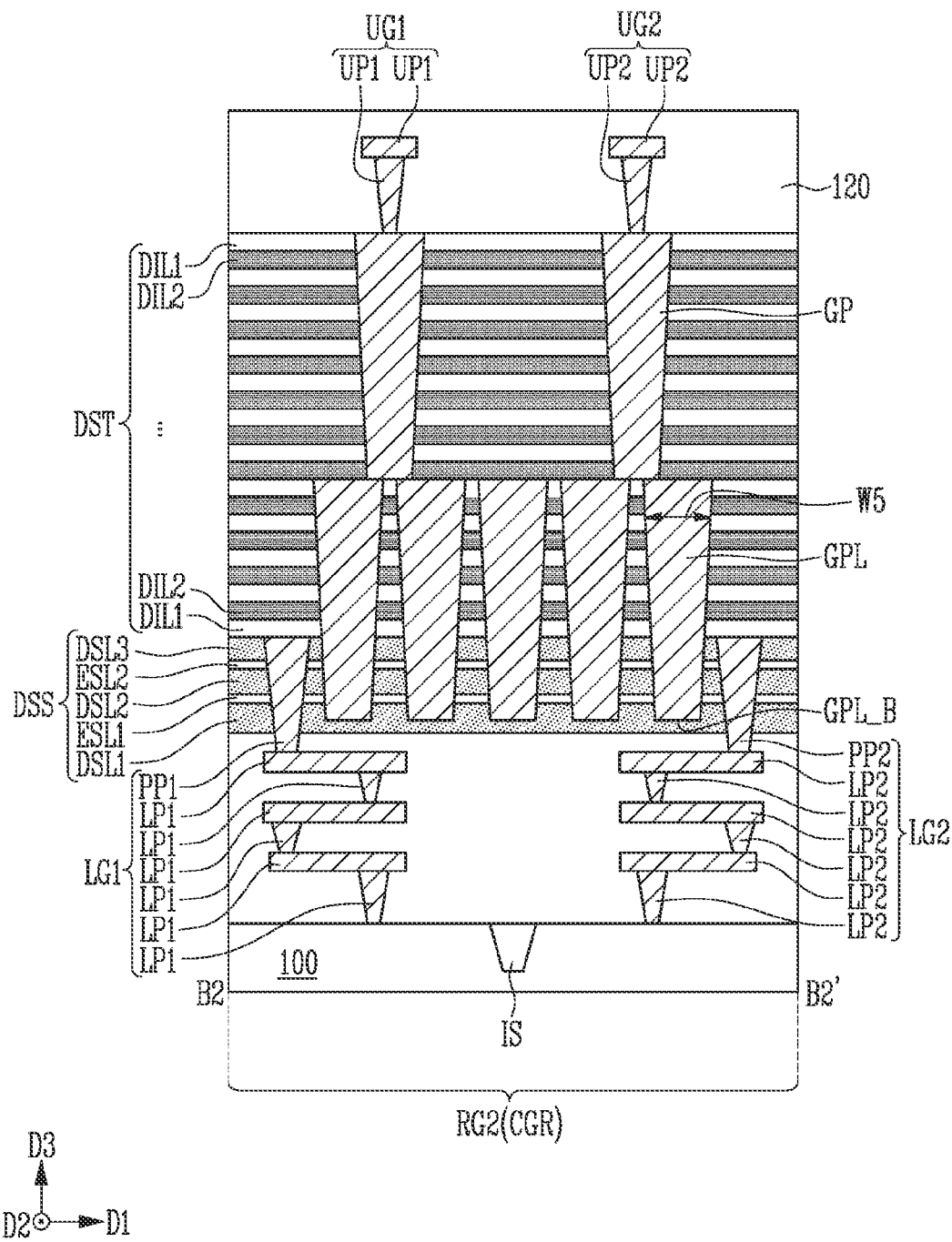
FIG. 6C is a sectional view taken along line B2-B2' shown in FIG. 6A.
Figure 6D:
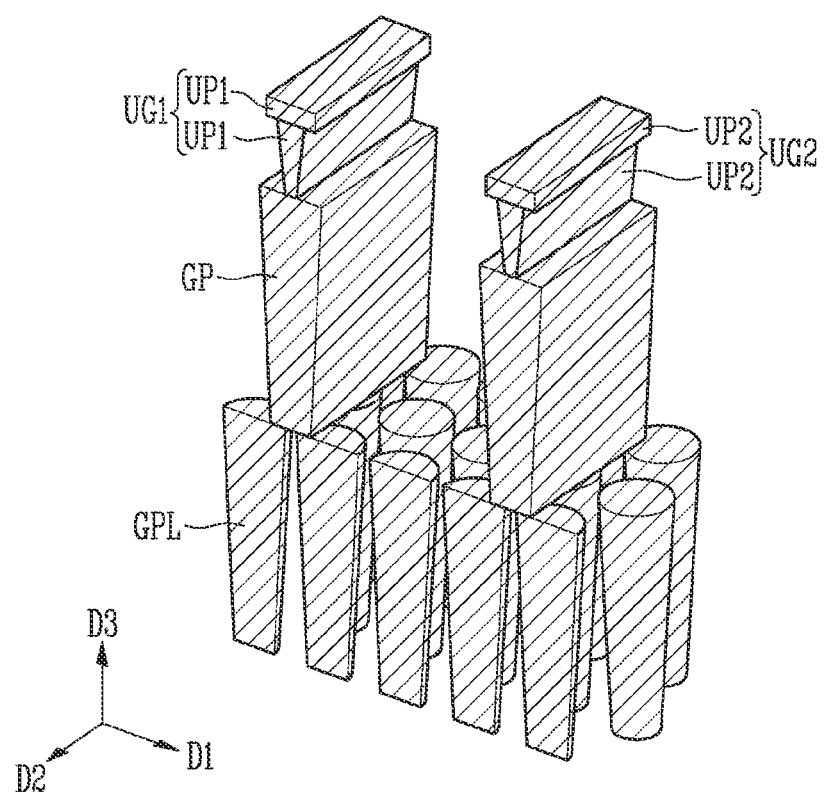
FIG. 6D is a perspective view illustrating a guard plug, a cell guard part, and an upper chip guard of the semiconductor device in accordance with the embodiments shown in FIGS. 6A to 6C.

FIG. 6A is a plan view of a semiconductor device in accordance with an embodiment of the present disclosure. FIG. 6B is a sectional view taken along line A2-A2' shown in FIG. 6A. FIG. 6C is a sectional view taken along line B2-B2' shown in FIG. 6A. FIG. 6D is a perspective view illustrating a guard plug, a cell guard part, and an upper chip guard of the semiconductor device in accordance with the embodiments shown in FIGS. 6A to 6C. Hereinafter, repeated descriptions of components already described above are omitted.

Referring to FIGS. 6A to 6D, a dummy source structure DSS may be provided on a first insulating layer 110. The dummy source structure DSS may be provided on a chip guard region CGR. The dummy source structure DSS may surround a cell source structure CSS.

The dummy source structure DSS may include a first dummy source layer DSL1, a first etch stop layer ESL1, a second dummy source layer DSL2, a second etch stop layer ESL2, and a third dummy source layer DSL3, which are sequentially stacked in the third direction D3.

A first lower chip guard LG1 may be provided in the first insulating layer 110 and the dummy source structure DSS. A second lower chip guard LG2 may be provided in the first insulating layer 110 and the dummy source structure DSS.

Guard plugs GPL may be provided, which penetrate a first part of a dummy stack structure DST. The first part of the dummy stack structure DST may be a lower portion of the dummy stack structure DST. Guard plugs GPL may extend in the third direction D3. The guard plugs GPL may have a cylindrical shape. The guard plugs GPL may be disposed on the chip guard region CGR of a substrate 100. The guard plugs GPL may be disposed on first regions RG1 and second regions RG2 of the substrate 100. The guard plugs GPL may surround cell plugs CPL and a cell stack structure CST. From the viewpoint of a plane shown in FIG. 6A, the cell stack structure CST and the cell plugs CPL may be disposed in a space surrounded by the guard plugs GPL.

The guard plugs GPL may be disposed at the same level as lower portions CPL_L of the cell plugs CPL. A level of a bottom surface GPL_B of the guard plug GPL may be equal to that of a bottom surface CPL_B of the cell plug CPL. The guard plugs GPL may include a conductive material. In an example, the guard plugs GPL may include tungsten.

A width of the guard plug GPL may become smaller with decreasing distance to the substrate 100. In an example, a width of the guard plug GPL in the first direction D1 may be defined as a fifth width W5, and the fifth width W5 may become smaller with closer proximity to the substrate 100.

The guard plug GPL may be connected to the dummy source structure DSS. A lower portion of the guard plug GPL may be disposed in the dummy source structure DSS. The guard plug GPL may penetrate the first and second etch stop layers ESL1 and ESL2 and the second and third dummy source layers DSL2 and DSL3 of the dummy source structure DSS. The lower portion of the guard plug GPL, an upper portion of a first penetration guard part PP1, an upper portion of a second penetration guard part PP2 may be disposed at the same level.

A distance between the guard plugs GPL may be equal to that between the cell plugs CPL or be greater than that between the cell plugs CPL. In an example, a distance between the guard plugs GPL in the first direction D1 may be equal to that between the cell plugs CPL in the first direction D1 or be greater than that between the cell plugs CPL in the first direction D1.

Cell guard parts GP may be provided, which penetrate a second part of the dummy stack structure DST. The second part of the dummy stack structure DST may be an upper portion of the dummy stack structure DST. The cell guard part GP may extend in the third direction D3. Each of the cell guard parts GP may surround the cell plugs CPL and the cell stack structure CST.

The cell guard parts GP may be disposed at the same level as an upper portion CPL_U of the cell plug CPL. The cell guard parts GP may be disposed on a plurality of guard plugs GPL. The cell guard parts GP may be connected to the plurality of guard plugs GPL. The cell guard parts GP may overlap with the plurality of guard plugs GPL. In an example, the cell guard parts GP may overlap with the plurality of guard plugs GPL in the third direction D3.

The cell guard parts GP may include first parts extending in the first direction D1 and second parts extending in the second direction D2. The first part of the cell guard parts GP may be disposed on the first region RG1 of the substrate 100. The second part of the cell guard parts GP may be disposed on the second region RG2 of the substrate 100. The first parts and the second parts of the cell guard parts GP may be connected to each other. The guard plugs GPL and the cell guard parts GP may be used as a chip guard of the semiconductor device.

A first upper chip guard UG1 and a second upper chip guard UG2 may be provided on the cell guard parts GP.

Figure 7:
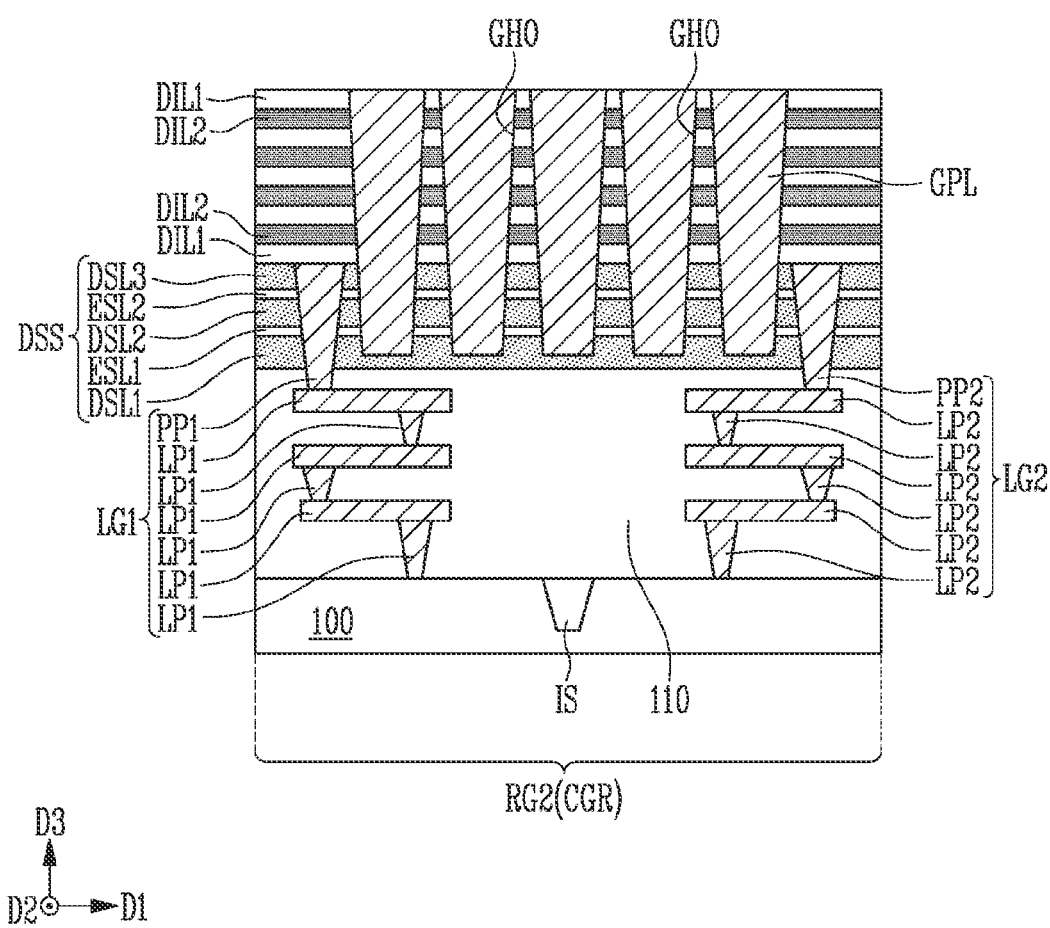
FIGS. 7, 8, and 9 are sectional views illustrating a manufacturing method of a semiconductor device in accordance with an embodiment of the present disclosure.
Figure 8:
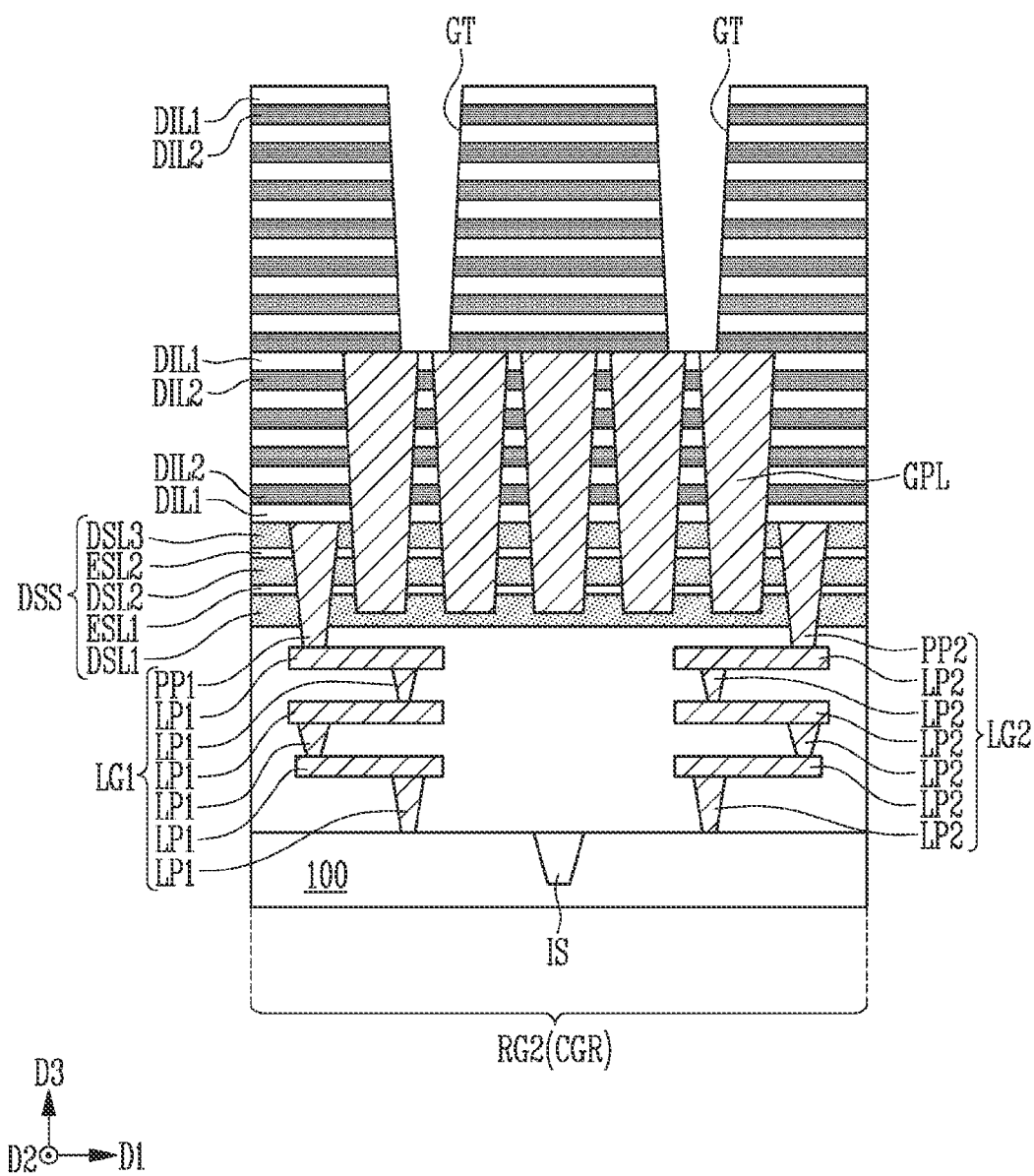
Figure 9:
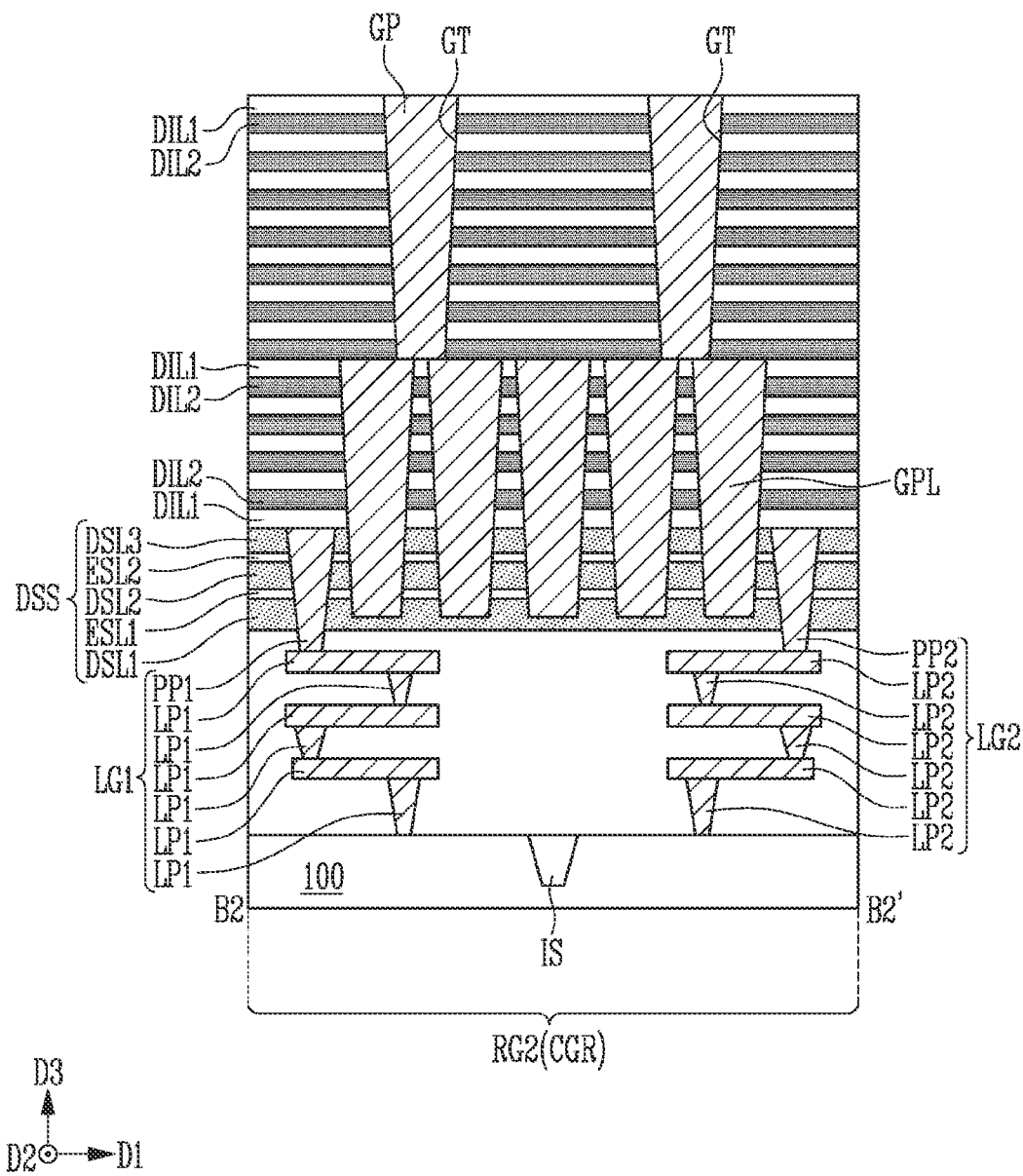

FIGS. 7, 8, and 9 are sectional views illustrating a manufacturing method of a semiconductor device in accordance with an embodiment of the present disclosure. Hereinafter, repeated descriptions of components already described above are omitted.

Referring to FIG. 7, a dummy source structure DSS may be formed on a first insulating layer 110. The dummy source structure DSS may be formed on a chip guard region CGR of a substrate 100.

First dummy stack layers DIL1 and second dummy stack layers DIL2 may be alternately formed on the dummy source structure DSS. The first dummy stack layers DIL1 and the second dummy stack layers DIL2 may be formed on the chip guard region CGR.

Guard plugs GPL may be formed, which penetrate the first dummy stack layers DIL1 and the second dummy stack layers DIL2.

Forming the guard plugs GPL may include forming guard holes GHO penetrating the first dummy stack layers DIL1 and the second dummy stack layers DIL2 and forming the guard plugs GPL in the guard holes GHO. The guard holes GHO may be simultaneously formed with first cell holes. The guard holes GHO and the first cell holes may be formed by simultaneously etching a cell stack structure CST (see FIG. 6B), a cell source structure CSS (see FIG. 6B), a dummy stack structure DST (see FIG. 6C), and the dummy source structure DSS. The guard holes GHO may surround the first cell holes. The guard plugs GPL may be simultaneously formed with cell sacrificial structures.

Referring to FIG. 8, first dummy stack layers DIL1 and second dummy stack layers DIL2 may be formed on the guard plugs GPL.

Subsequently, guard trenches GT may be formed, which penetrate the first dummy stack layers DIL1 and the second dummy stack layers DIL2 on the guard plugs. The guard trenches GT may overlap a plurality of guard plugs GPL. When the guard trenches GT are formed, top surfaces of the guard plugs GPL may be exposed. The guard trenches GT may surround second cell holes.

Referring to FIG. 9, cell guard parts GP may be formed in the guard trenches GT.

Figure 10:
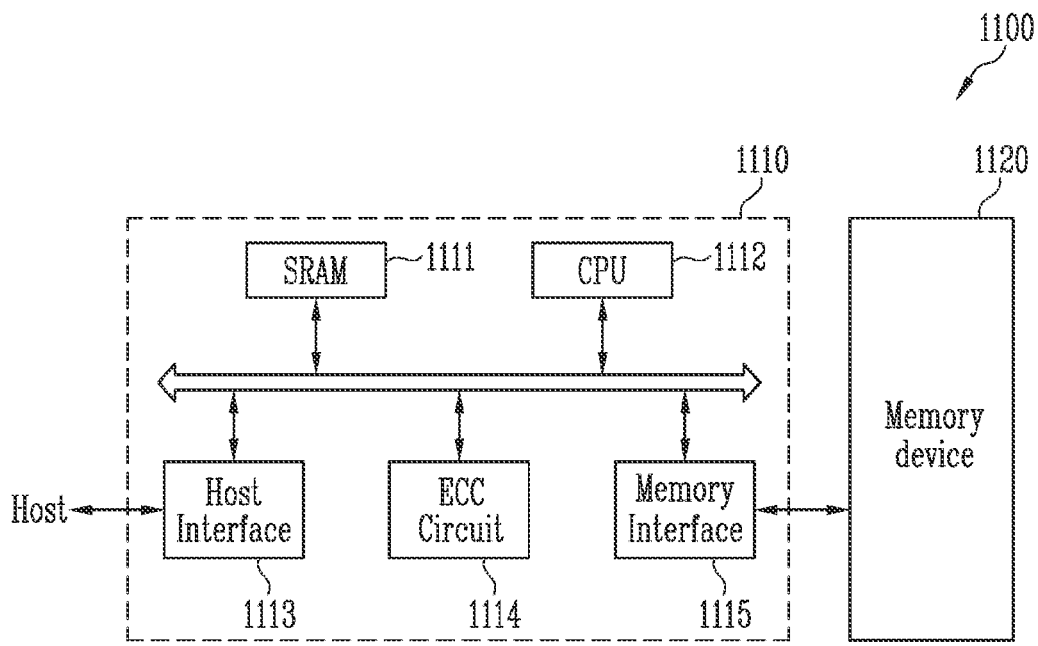
FIG. 10 is a block diagram illustrating a configuration of a memory system in accordance with an embodiment of the present disclosure.

FIG. 10 is a block diagram illustrating a configuration of a memory system 1100 in accordance with an embodiment of the present disclosure.

Referring to FIG. 10, the memory system 1100 includes a memory device 1120 and a memory controller 1110.

The memory device 1120 may include the semiconductor devices in accordance with the embodiments of the present disclosure. The memory device 1120 may be a multi-chip package configured with a plurality of flash memory chips.

The memory controller 1110 is configured to control the memory device 1120 and may include Static Random Access Memory (SRAM) 1111, a Central Processing Unit (CPU) 1112, a host interface 1113, an Error Correction Code (ECC) circuit 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects errors included in data read from the memory device 1120, and the memory interface 1115 interfaces with the memory device 1120. In addition, the memory controller 1110 may further include ROM for storing code data for interfacing with the host, and the like.

The memory system 1100 configured as described above may be a memory card or a Solid State Disk (SSD), in which the memory device 1120 is combined with the controller memory 1110. For example, when the memory system 1100 is an SSD, the memory controller 1110 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 11:
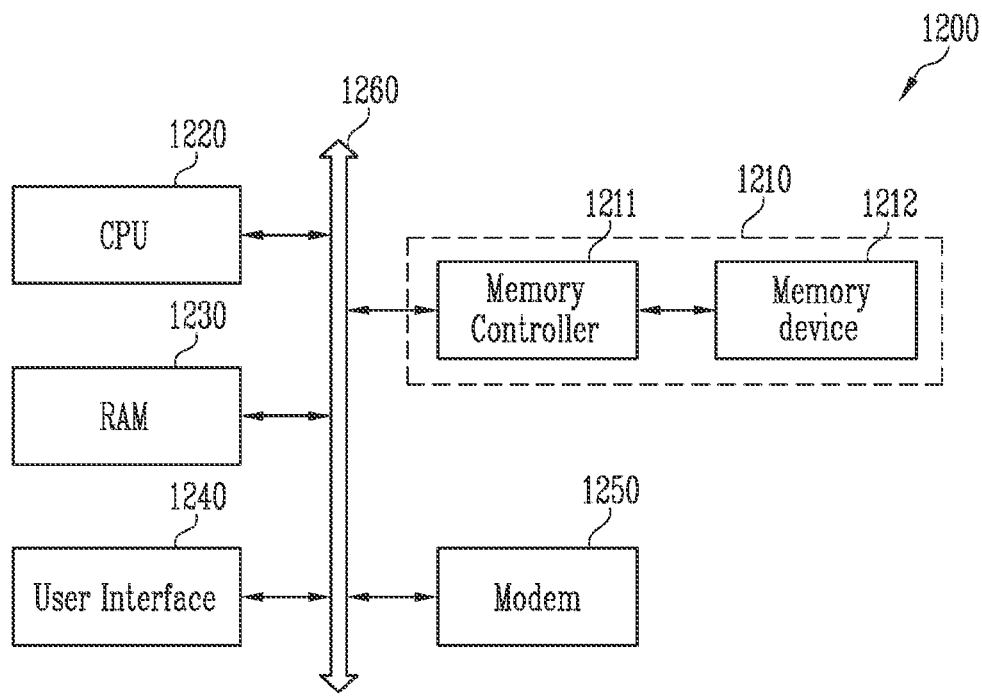
FIG. 11 is a block diagram illustrating a configuration of a computing system in accordance with an embodiment of the present disclosure.

FIG. 11 is a block diagram illustrating a configuration of a computing system 1200 in accordance with an embodiment of the present disclosure.

Referring to FIG. 11, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211, which are similar to those described with reference to FIG. 10.

In a semiconductor device in accordance with the present disclosure, a cell chip guard is formed to be divided into a first cell guard part and a second cell guard part, to help keep a void or crack from forming in the cell chip guard, thereby improving the operational reliability of the semiconductor device.

Only a limited number of embodiments of the present disclosure have been illustrated and described in the drawings and specification. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood to have by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a cell stack structure including first cell stack layers and stack conductive layers, which are alternately stacked;
   a dummy stack structure including first dummy stack layers and second dummy stack layers, which are alternately stacked;
   a cell plug penetrating the cell stack structure; and
   a cell chip guard penetrating the dummy stack structure to extend horizontally in a linear shape, the cell chip guard surrounding the cell stack structure and the cell plug from all horizontal directions,
   wherein a level of a bottom surface of the cell chip guard is substantially equal to a level of a bottom surface of the cell plug.

2. The semiconductor device of claim 1, wherein a level of a top surface of the cell chip guard is substantially equal to a level of a top surface of the cell plug.

3. The semiconductor device of claim 1, wherein the cell plug includes an upper portion and a lower portion, and wherein the cell chip guard includes:
   a first cell guard part disposed at the same level as the lower portion of the cell plug; and a second cell guard part disposed at the same level as the upper portion of the cell plug.

4. The semiconductor device of claim 3, wherein a maximum width of the first cell guard part is greater than a minimum width of the second cell guard part.

5. The semiconductor device of claim 1, wherein the dummy stack structure surrounds the cell stack structure.

6. The semiconductor device of claim 1, further comprising:
a cell source structure connected to the cell plug; and
a dummy source structure connected to the cell chip guard, wherein the dummy source structure surrounds the cell source structure.

7. The semiconductor device of claim 1,
wherein the cell source structure includes a first cell source layer, a second cell source layer, and a third cell source layer, which are sequentially stacked, and
wherein the dummy source structure includes a first dummy source layer, a first etch stop layer, a second dummy source layer, a second etch stop layer, and a third dummy source layer, which are sequentially stacked.

8. The semiconductor device of claim 7,
wherein the first dummy source layer and the first cell source layer are disposed at the same level, and
wherein the third dummy source layer and the third cell source layer are disposed at the same level.

9. A semiconductor device comprising:
a cell stack structure including stack conductive layers and first cell stack layers, which are alternately stacked;
a dummy stack structure including first dummy stack layers and second dummy stack layers, which are alternately stacked;
a cell plug penetrating the cell stack structure; and
guard plugs penetrating a lower portion of the dummy stack structure, the guard plugs surrounding the cell stack structure and the cell plug from all horizontal directions, and
a cell guard part penetrating an upper portion of the dummy stack structure to extend horizontally in a linear shape, wherein the cell guard part overlaps with the guard plugs,
wherein a level of bottom surfaces of the guard plugs is substantially equal to a level of a bottom surface of the cell plug.

10. The semiconductor device of claim 9, wherein the cell guard part surrounds the cell stack structure and the cell plug.

11. The semiconductor device of claim 9, further comprising:
a cell source structure connected to the cell plug; and
a dummy source structure connected to the guard plugs, wherein the dummy source structure surrounds the cell source structure.

12. The semiconductor device of claim 11, further comprising a lower chip guard penetrating the dummy source structure.

13. The semiconductor device of claim 12, wherein the lower chip guard surrounds the cell source structure.

14. A semiconductor device comprising:
a cell stack structure including first cell stack layers and stack conductive layers, which are alternately stacked;
a dummy stack structure including first dummy stack layers and second dummy stack layers, which are alternately stacked;
a cell plug penetrating the cell stack structure; and
a cell chip guard penetrating the dummy stack structure to extend horizontally in a linear shape, the cell chip guard surrounding the cell stack structure and the cell plug from all horizontal directions,
wherein the cell chip guard includes a first cell guard part penetrating a lower portion of the dummy stack structure and a second cell guard part penetrating an upper portion of the dummy stack structure,
wherein the cell plug includes an upper portion and a lower portion, and
wherein a level of a boundary between the upper portion and the lower portion of the cell plug is substantially equal to a level of a boundary between the first and second cell guard parts.

15. The semiconductor device of claim 14, wherein a maximum width of the lower portion of the cell plug is greater than a minimum width of the upper portion of the cell plug.

16. The semiconductor device of claim 14, wherein a level of a bottom surface of the first cell guard part is substantially equal to a level of a bottom surface of the lower portion of the cell plug.

17. The semiconductor device of claim 14, further comprising a dummy source structure connected to the first cell guard part.

18. The semiconductor device of claim 17, further comprising a lower chip guard penetrating the dummy source structure.

19. The semiconductor device of claim 17, wherein a lower portion of the first cell guard part is disposed in the dummy source structure.

* * * * *